(12) United States Patent
Wang et al.

(10) Patent No.: US 11,099,101 B2
(45) Date of Patent: Aug. 24, 2021

(54) METHOD FOR ESTIMATING BEARING FAULT SEVERITY FOR INDUCTION MOTORS

(71) Applicants: Mitsubishi Electric Research Laboratories, Inc., Cambridge, MA (US); Mitsubishi Electric Corporation, Tokyo (JP)

(72) Inventors: Bingnan Wang, Belmont, MA (US); Shen Zhang, Cambridge, MA (US); Makoto Kanemaru, Tokyo (JP); Chungwei Lin, Cambridge, MA (US); Dehong Liu, Lexington, MA (US); Koon Hoo Teo, Lexington, MA (US)

(73) Assignees: Mitsubishi Electric Research Laboratories, Inc., Cambridge, MA (US); Mitsubishi Electric Corporation, Tokyo (JP)

( * ) Notice: Subject to any disclaimer, the term of this patent is extended or adjusted under 35 U.S.C. 154(b) by 104 days.

(21) Appl. No.: 16/515,564

(22) Filed: Jul. 18, 2019

(65) Prior Publication Data

US 2020/0348207 A1 Nov. 5, 2020

Related U.S. Application Data

(60) Provisional application No. 62/842,544, filed on May 3, 2019.

(51) Int. Cl.
*G01M 13/04* (2019.01)
*G01R 31/34* (2020.01)
*H02H 7/08* (2006.01)

(52) U.S. Cl.
CPC ........... *G01M 13/04* (2013.01); *G01R 31/343* (2013.01); *H02H 7/08* (2013.01)

(58) Field of Classification Search
CPC ........ G01M 13/04; G01R 31/343; H02H 7/08
See application file for complete search history.

(56) References Cited

U.S. PATENT DOCUMENTS

| | | | | |
|---|---|---|---|---|
| 5,726,905 A | * | 3/1998 | Yazici | G01M 13/04 324/545 |
| 2008/0309366 A1 | * | 12/2008 | Zhou | G01M 13/04 324/765.01 |
| 2016/0266208 A1 | * | 9/2016 | Athikessavan | G01R 31/346 |

* cited by examiner

*Primary Examiner* — Manuel L Barbee
(74) *Attorney, Agent, or Firm* — Gennadiy Vinokur; Hironori Tsukamoto

(57) ABSTRACT

A system for estimating a severity of a bearing fault in an induction motor, uses a set of filters and a set of quantitative models designed for a set of fault frequencies. The system, upon receiving the measurements of the stator current, extracts the first fault current from the stator current using the first filter, determine the first mutual inductance variation from the first fault current using the first quantitative model, and classify the first mutual inductance variation with the fault severity classifier to determine the severity of a first type of fault in the induction motor. Similarly, the system classifies a second type of fault using the second filter and the second quantitative model. The system outputs one or combination of the severity of the first type of fault in the induction motor and the severity of the second type of fault in the induction motor.

15 Claims, 14 Drawing Sheets

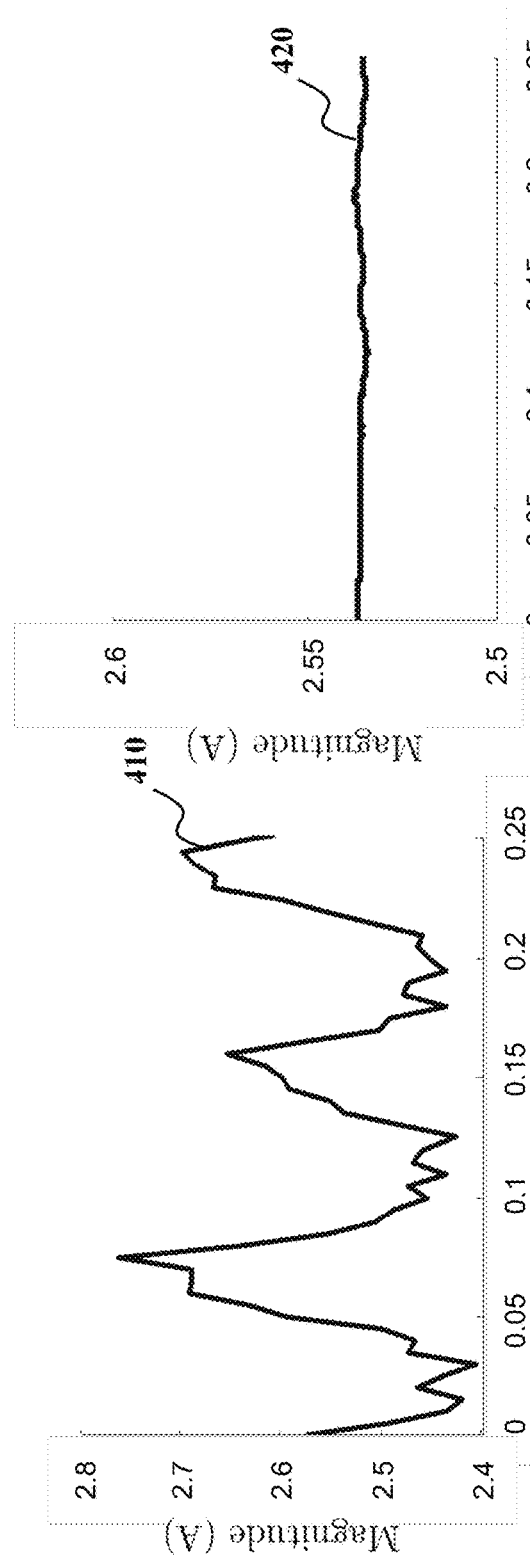
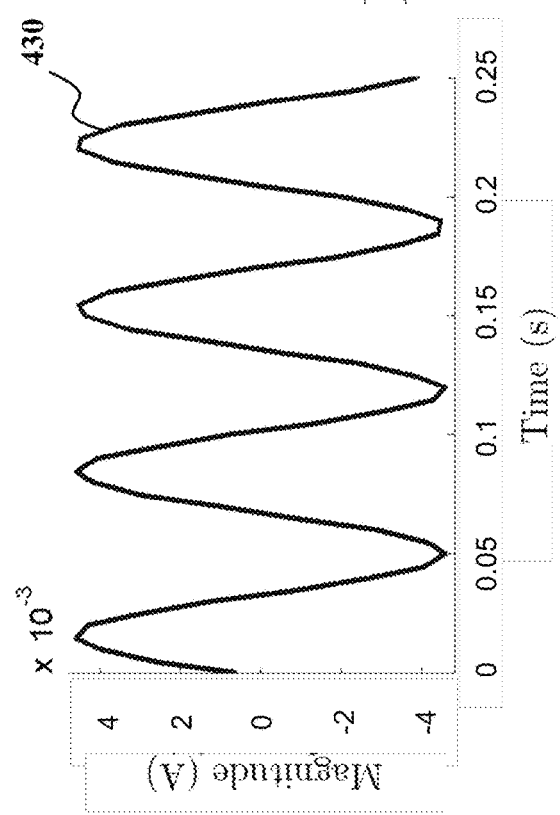
FIG. 4A
FIG. 4B
FIG. 4C

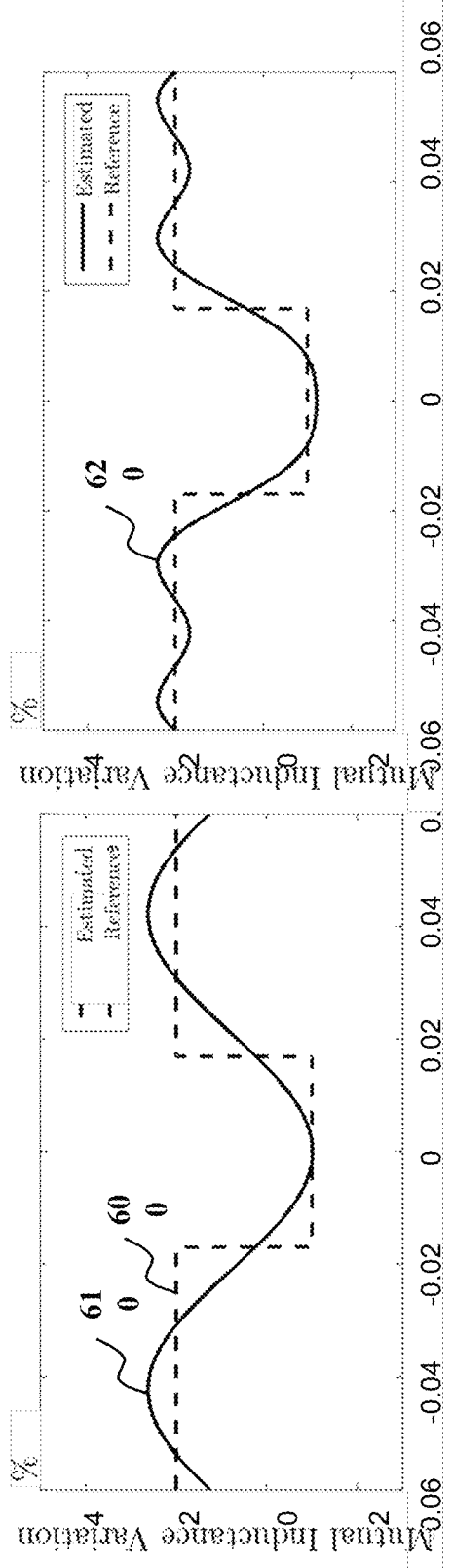
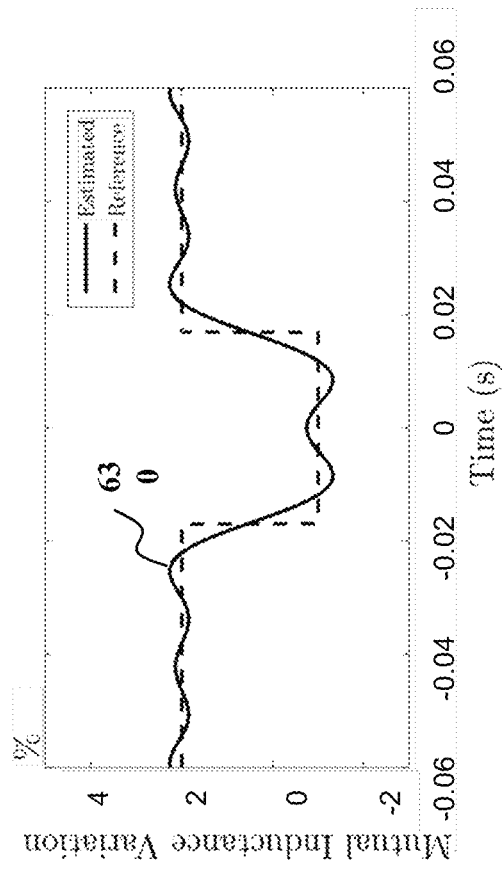
FIG. 6A  FIG. 6B  FIG. 6C

METHOD FOR ESTIMATING BEARING FAULT SEVERITY FOR INDUCTION MOTORS

TECHNICAL FIELD

This invention relates generally to induction motors, and more generally to estimating a rolling-element bearing fault severity for the motors.

BACKGROUND

Induction machines are broadly used in various industry applications that include pumps, chemical, petrochemical, electrified transportation systems, etc. In many applications, these machines are operated under some unfavorable conditions, such as high ambient temperature, high moisture and overload, which can eventually result in motor malfunctions that lead to high maintenance cost and severe financial loss due to the unexpected downtime.

The malfunction of induction machines can be generally attributed to various faults of different categories, which include the drive inverter failures, stator winding insulation breakdown, broken rotor bar faults, as well as bearing faults and eccentricity. Several surveys of faults of induction machines conducted by the IEEE Industry Application Society (IEEE-IAS) and the Japan Electrical Manufacturers' Association (JEMA) reveal that the bearing faults are the most common fault type and account for more than 33% percent. Therefore, there is a strong demand for developing bearing fault detection algorithm to identify a bearing fault for motors with any power ratings.

One type of bearing fault detection is based on vibration analysis. Usually measured in the form of displacement, speed, or acceleration, the vibration signal is a direct mechanical response of the impact between the rolling elements and the inner/outer raceways if some defects or wears are developed due to fatigue or excessive radial load. Therefore, a bearing fault can be detected by measuring the vibration signal and performing certain signal processing techniques. For instance, U.S. Pat. No. 9,574,965 discloses a system to monitor changes in clearance distances between the sensor and a motor rotating component. Then the frequency spectrum of the clearance signal is analyzed, and a motor bearing fault or imbalance can be determined if the spectral energy of the clearance signal exceeds a designated threshold. Similarly, US2013/0096848 follows the same philosophy but measures acceleration instead of displacement to represent the vibration signal.

Another type of bearing fault detection method measures the acoustic noise emissions in the ultrasonic frequency range and uses this information to determine the presence of a bearing fault, see, e.g., US2012/0316796. Similar to the mechanism of generating vibration signals, the high frequency ultrasonic acoustic noise signal is also generated by the impacts of the rolling elements on the bearing raceways. This high frequency signal can be either demodulated into the audio spectrum to perform audio detection or transformed into the FFT frequency spectrum. Then a bearing fault can be automatically detected by comparing with the pre-stored spectrums of known bearing health conditions, rotary speed and the number of balls.

However, the accuracy of bearing fault diagnostics based on vibration or acoustic signals can be influenced by background noise due to external mechanical excitation motion, while its sensitivity is also subject to change based on sensor mounting positions, see, e.g., US2014/0303913 and U.S. Pat. No. 9,618,583. Therefore, an alternative approach for bearing fault detection is accomplished by analyzing the induction machine stator current, which is measured in most motor control centers or drive inverters and thus would not bring extra device or installation costs.

Despite the advantages such as economic savings and simple implementation, accomplishing bearing fault detection with stator current signature analysis can encounter many practical issues. For example, the magnitude of stator currents at bearing fault signature frequencies can vary at different loads, different speeds, and different power ratings of the motors themselves, thus bringing challenges to identify the threshold stator current values to trigger a fault alarm at an arbitrary operating condition. Therefore, a thorough and systematic testing is usually required while the motor is still at the healthy condition, and the healthy data would be collected while the targeted motor is running at different load and speed. Moreover, this process needs to be repeated for any motor with a different power rating. This mechanism is summarized as a "Learning Stage" in U.S. Pat. No. 5,726,905, and the stator currents at the healthy conditions are referred to as the "baseline electrical signals" in US2013/0049733.

Besides FFT, other advanced signal processing techniques and statistical methods are also applied to increase the accuracy and sensitivity of bearing fault detection with current signature analysis. For instance, U.S. Pat. No. 6,727,725 discloses an apparatus to measure the motor starting transient current and apply wavelet transform. The wavelet frequency sub-bands, which convey both temporal and spectral relations, were compared to detect changes in the RMS values due to bearing defect-induced resonance during motor start-up. To detect subtle bearing defects or even the incipient faulty stage known as general roughness, U.S. Pat. No. 7,777,516 applies a Wiener filter with functions of current noise cancellations, the processor with this algorithm embedded in repeatedly receives real-time operating current data from the operating motor and removes the noise component to isolate any fault components present in the operating current data.

However, the so-called "Learning Stage" or intensive data acquisition/storage is still required for most existing methods up to date, which sometimes requires heavy dataset to detect even nonfatal faults. In addition, the detection of bearing faults is mostly performed in a qualitative manner, whereas the exact faulty condition is not able to be quantified. Therefore, there exists a need for a method and a system that are universal, accurate and quantitative for detecting bearing faults in induction motors based on current signature analysis.

SUMMARY

It is an object of some embodiments to estimate different types of fault in an operation of an induction motor. Additionally, or alternatively, it is another object of some embodiments to provide a method for estimating the fault severity (FS) of the rolling-element bearings mounted on an induction motor with motor current signature analysis (MCSA). Additionally, or alternatively, it is another object of some embodiments to estimate the fault severity without the need for additional measurements and/or sensors in addition to the sensor measuring the stator current in the induction motor.

Some embodiments are based on recognition that the presence of the fault current at a specific fault frequency is indicative of a type of the fault. However, a magnitude of the fault current at the specific fault frequency is not necessarily indicative of the severity of the fault. This is because the magnitude varies in dependence of the load on the motor and motor speed. So, for the same severity of the fault, different magnitudes of the fault current can be detected. However, some embodiments are based on realization that the magnitude of air gap variations between a stator and a rotor of the induction motor caused by the fault is indicative of a severity of the fault in the induction motors regardless of the type of the induction motor, while frequency of the air gap variations are indicative of the type of the fault. Indeed, the bigger the magnitude of the variation of the air gap with respect to the normal (constant) value of the air gap, the bigger the severity of the fault. In addition, some embodiments recognized that for the same type of fault and the same severity of the fault, the air gap variations are the same or at least similar for different types of the induction motors. Therefore, the determination of the air gap variations can serve as an indicator of the severity of the fault. To that end, regardless of the types of the motor or load acting on the motor, the magnitude variations of the air gap are indicative of the severity and independent from the load and type of the motor. However, the air gap variations are difficult and/or expensive to measure.

Some embodiments are based on recognition that the magnitude of the air gap can be determined through magnitude of mutual inductance. Specifically, variations of the air gap can be determined using a transfer function of the variation of the mutual inductance. In addition, the mutual inductance is relevant to magnitude of the fault current through the qualitative electrical model of the motor. As a result, some embodiments convert the fault current into indication of the magnitude of air gap variation without additional sensors and compare air gap variation with threshold determined in advance to estimate the severity. For example, the indication of the magnitude of air gap variation can be the variation of the mutual inductance and/or the actual value of the air gap variation.

Some embodiments are based on recognition that to use the variation of mutual inductance as an indication of an air gap variation, the variation of the mutual inductance due to the fault needs to be separated from other causes of the mutual inductance variations. Hence, there is a need to accurately estimate characteristics of the fault current. Some embodiments are based on recognition that even with the complete knowledge of the stator current, it is challenging to accurately extract the characteristic fault current due to its magnitude is relatively small, typically 30-40 dB lower, and can be even 50 dB lower than that of the fundamental frequency current. However, to estimate the mutual inductance variation from the faulty current, the faulty current needs to be accurately extracted from the measured stator current.

Some embodiments are based on recognition that for specific types of faults there are specific values of the frequency of the fault current. Such a frequency is reference herein as a faulty frequency. For different types of the bearing fault there are different values of the faulty frequency. For example, in some embodiments there are four different faulty frequencies for four different types of fault of the induction motor. To that end, some embodiments determine a set of frequency filters and a set of corresponding quantitative models for the specific values of the faulty frequencies. Each frequency filter is configured to extract a fault current of a fault frequency from the stator current, and each quantitative model is configured to relate the fault current of the fault frequency to a mutual inductance variation for the fault frequency. In such a manner, the accuracy of estimation of the mutual inductance variation increases without the need for a learning stage or additional sensors.

During the operation of the motor, some embodiments test a transfer function transforming the mutual inductance variation to an air gap variation for each of the fault frequency, and compare the frequencies and magnitudes of the relative air gap variations against the predetermined thresholds to determine both the type of the fault and the severity of the fault. For example, in different implementations, a fault alarm and/or fault control method is triggered when the magnitude of the relative air gap variation for a specific faulty frequency is above a threshold.

To that end, some embodiments perform estimation of severity of different types of bearing faults in an induction motor in a frequency domain segmented for predetermined types of bearing faults. For example, each filter is configured in a frequency domain for a specific fault frequency predetermined based on the type of the fault. Similarly, the quantitative models are configured for the same predetermined fault frequencies. In some embodiments, each pair of a filter and a quantitative model determined for the same fault frequency form a separate detector. Segmented frequency domain allows to fine tune the filters and the quantitative models to increase the accuracy of mutual inductance estimation without the need for additional sensors.

Some embodiments are based on a quantitative electrical model and a transfer function. The bearing fault severity is estimated in two stages. During the first stage, the change of induction motor mutual inductance is identified from the measured stator current data by applying a quantitative electrical model. During the second stage, the motor air gap displacement is estimated. The second stage can be performed by two embodiments. One embodiment uses a simplified cosine function of the fault frequency to represent the periodic vibration pulses generated by the impacts of the rolling elements on the bearing raceways. The other embodiment uses a series of fault frequency harmonics to reconstruct the vibration pulses in a more accurate manner. Because the quantitative electrical model addresses the analytical relationship between mutual inductance variation and its stator current response, instead of simply listing the characteristic fault frequencies which only determines a bearing fault type, the quantitative electrical model together with a transfer function can provide an estimation of the bearing fault severity in terms of motor air gap displacement.

Accordingly, one embodiment discloses a system for estimating a severity of a bearing fault in an induction motor. The system includes an input interface configured to accept measurements of a stator current during an operation of the induction motor; a memory configured to store a set of filters, each filter is configured to extract a fault current of a fault frequency from the stator current, the set of filters includes a first filter to extract a first fault current of a first fault frequency and a second filter to extract a second fault current of a second fault frequency; and a set of quantitative models, each quantitative model is configured to relate the fault current of the fault frequency to a mutual inductance variation for the fault frequency, the set of quantitative models includes a first quantitative model to relate a magnitude of the first fault current to a first mutual inductance variation for the first fault frequency and a second quantitative model to relate the second fault current to a second mutual inductance variation for the second fault frequency; at least one fault severity classifier for estimating a severity of the fault in the induction motor for each of the fault frequency based on the mutual inductance variation for the fault frequency; a processor configured, upon receiving the measurements of the stator current, to extract the first fault current from the stator current using the first filter, determine the first mutual inductance variation from the first fault current using the first quantitative model, and classify the first mutual inductance variation with the fault severity classifier to determine the severity of a first type of fault in the induction motor; and extract the second fault current from the stator current using the second filter, determine the second mutual inductance variation from the second fault current using the second quantitative model, and classify the second mutual inductance variation with the fault severity classifier to determine the severity of a second type of fault in the induction motor; and an output interface configured to output one or combination of the severity of the first type of fault in the induction motor and the severity of the second type of fault in the induction motor.

Another embodiment discloses a method for estimating a severity of a bearing fault in an induction motor, wherein the method uses a processor coupled to a memory storing a set of filters, each filter is configured to extract a fault current of a fault frequency from the stator current, the set of filters includes a first filter to extract a first fault current of a first fault frequency and a second filter to extract a second fault current of a second fault frequency; a set of quantitative models, each quantitative model is configured to relate the fault current of the fault frequency to a mutual inductance variation for the fault frequency, the set of quantitative models includes a first quantitative model to relate a magnitude of the first fault current to a first mutual inductance variation for the first fault frequency and a second quantitative model to relate the second fault current to a second mutual inductance variation for the second fault frequency; and at least one fault severity classifier for estimating a severity of the fault in the induction motor for each of the fault frequency based on the mutual inductance variation for the fault frequency, wherein the processor is coupled with stored instructions implementing the method, wherein the instructions, when executed by the processor carry out steps of the method, that includes accepting measurements of a stator current during an operation of the induction motor; extracting the first fault current from the stator current using the first filter, determining the first mutual inductance variation from the first fault current using the first quantitative model, and classifying the first mutual inductance variation with the fault severity classifier to determine the severity of a first type of fault in the induction motor; extracting the second fault current from the stator current using the second filter, determining the second mutual inductance variation from the second fault current using the second quantitative model, and classifying the second mutual inductance variation with the fault severity classifier to determine the severity of a second type of fault in the induction motor; and outputting one or combination of the severity of the first type of fault in the induction motor and the severity of the second type of fault in the induction motor.

Yet another embodiment discloses a non-transitory computer readable storage medium embodied thereon a program executable by a processor for performing a method, the storage medium stores a set of filters, each filter is configured to extract a fault current of a fault frequency from the stator current, the set of filters includes a first filter to extract a first fault current of a first fault frequency and a second filter to extract a second fault current of a second fault frequency; a set of quantitative models, each quantitative model is configured to relate the fault current of the fault frequency to a mutual inductance variation for the fault frequency, the set of quantitative models includes a first quantitative model to relate a magnitude of the first fault current to a first mutual inductance variation for the first fault frequency and a second quantitative model to relate the second fault current to a second mutual inductance variation for the second fault frequency; and at least one fault severity classifier for estimating a severity of the fault in the induction motor for each of the fault frequency based on the mutual inductance variation for the fault frequency, the method includes accepting measurements of a stator current during an operation of the induction motor; extracting the first fault current from the stator current using the first filter, determining the first mutual inductance variation from the first fault current using the first quantitative model, and classifying the first mutual inductance variation with the fault severity classifier to determine the severity of a first type of fault in the induction motor; extracting the second fault current from the stator current using the second filter, determining the second mutual inductance variation from the second fault current using the second quantitative model, and classifying the second mutual inductance variation with the fault severity classifier to determine the severity of a second type of fault in the induction motor; and outputting one or combination of the severity of the first type of fault in the induction motor and the severity of the second type of fault in the induction motor.

BRIEF DESCRIPTION OF THE DRAWINGS

FIG. 4A, FIG. 4B and FIG. 4C demonstrate the exemplar plots for operation of an embodiment of FIG. 3.

FIG. 6A, FIG. 6B and FIG. 6C show exemplar plots for estimating mutual inductance variation profile according to some embodiments.

DETAILED DESCRIPTION

System Overview

Figure 1A:
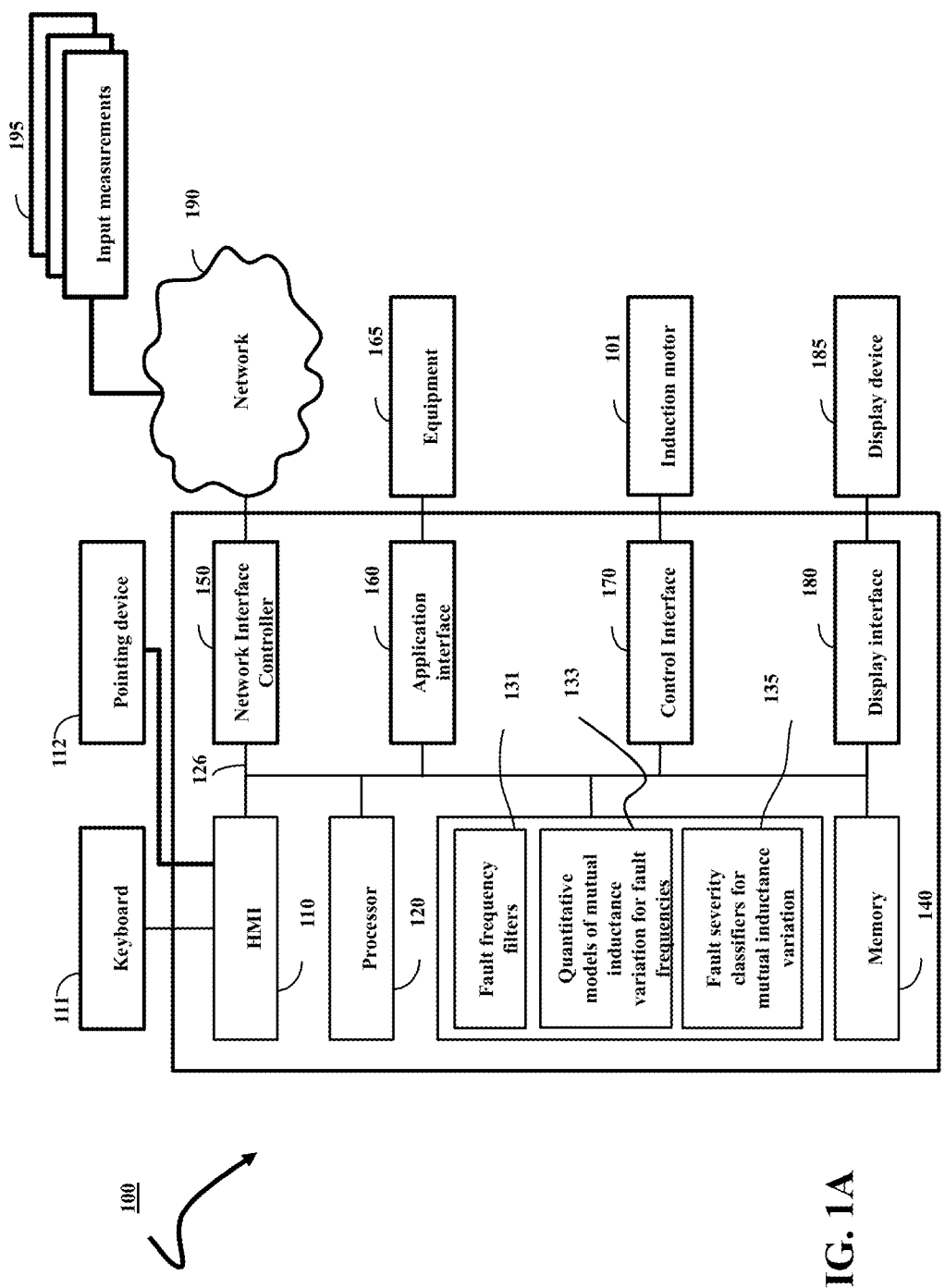
FIG. 1A and FIG. 1B show block diagrams of a system 100 for detecting and/or classifying type and severity of faults in an operation of an induction motor according to some embodiments.
Figure 1B:
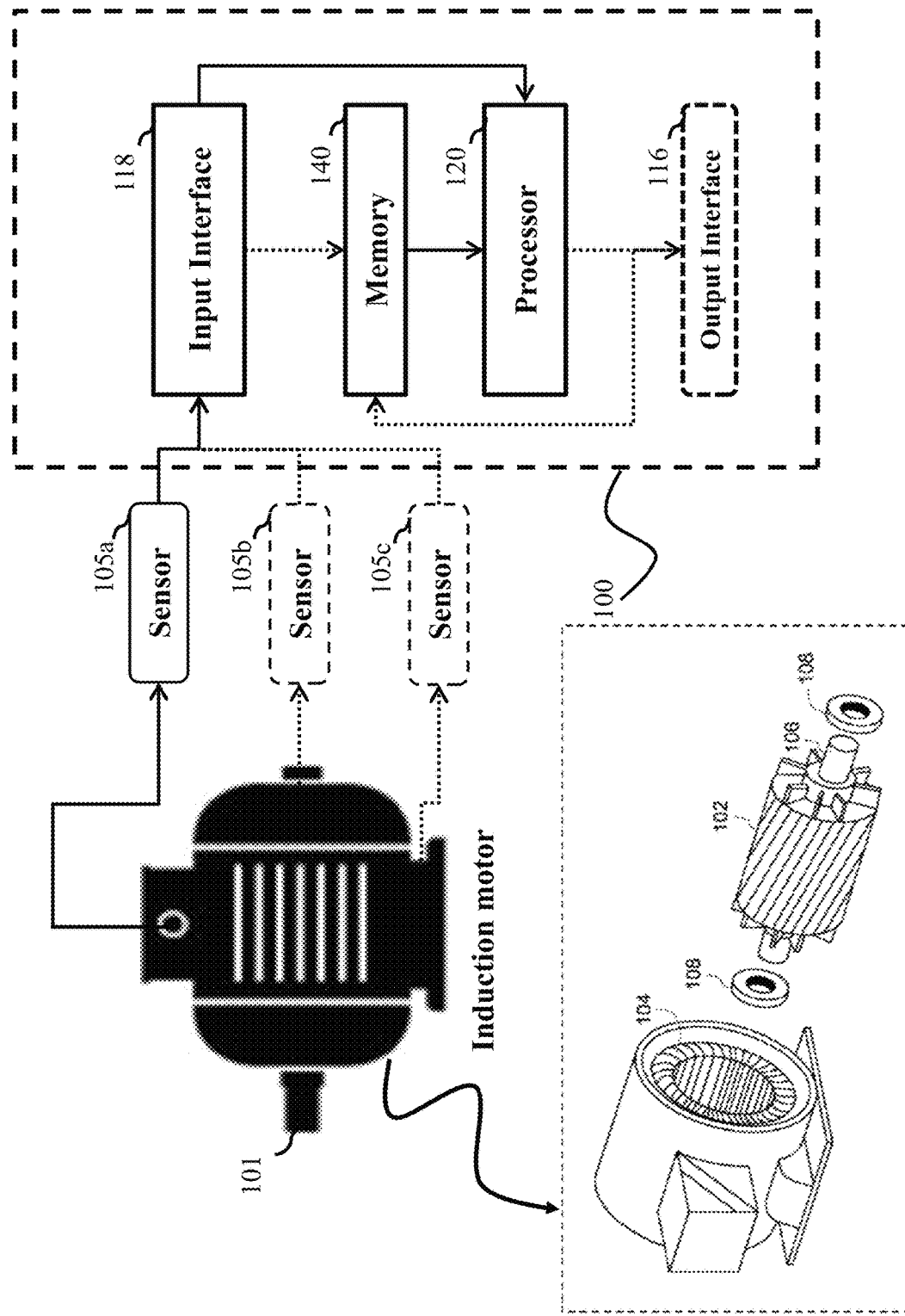

FIG. 1A and FIG. 1B show block diagrams of a system 100 for detecting and/or classifying type and severity of faults in an operation of an induction motor 101 according to some embodiments. For example, the induction motor 101 includes a rotor assembly 102, a stator assembly 104, a main shaft 106, and two main bearings 108. In this example, the induction motor 101 is a squirrel-cage induction motor. A bearing defect of the assembly 108 is a typical fault for such an induction motor, which includes a cage defect of hitting the inner/outer bearing raceways, an inner/outer raceway defect of hitting the rolling elements, and a rolling element defect of hitting the raceways.

The system 100 can be used for monitoring and controlling the operation of the induction motor 101 by taking various measurements as inputs in accordance with embodiments. For example, a controller coupled with the induction motor 101 and the system 100 can control operations of the induction motor based on inputs received from sensors 105a, 105b, and/or 105c configured to acquire data 195 pertaining to operating conditions of the induction motor 101. According to certain embodiments, the electrical signal sensors can be current and/or voltage sensors for acquiring current and voltage data pertaining to the induction motor 101. For example, the current sensor senses current data from one or more of the multiple phases of the induction motor. More specifically, in the case of the induction motor is a 3-phase induction motor, the current and voltage sensors sense the current and voltage data from the three phases of the 3-phase induction motor. In some implementations, the input measurements 195 are measurements of current of the stator 104.

The system 100 is configured for estimating a severity of a bearing fault in an induction motor 101. Examples of bearing fault in an induction motor 101 include a cage defect, inner/outer raceway defect, and rolling element defect. In one embodiment, the current and voltage sensors respectively detect stator current and voltage data from the stator assembly 104 of the induction motor 101. The current data and voltage data acquired from the sensors is communicated to the controller and/or the fault detection module for further processing and analysis. The analysis includes performing current signature analysis (CSA) to detect faults within the induction motor 101. In some embodiments, upon detecting the fault, the system 100 interrupts the operation of the induction motor for further inspection or repair.

The system 100 can have a number of input interfaces 118 and output interfaces 116 connecting the system 100 with other systems and devices. The input interface 108 is configured to accept measurements of a stator current during an operation of the induction motor. The output interface is configured to output severities of the faults in the induction motor.

For example, the input interface 118 can include a network interface controller (NIC) 150 adapted to connect the system 100 through a bus 126 to a network 190. Through the network 190, either wirelessly or through the wires, the system 100 can receive input signal 195 including time series samples of measurements of an operation of the induction motor. The measurements of the input signal 195 are measurements from one or a combination of sensors 105a, 105b, and 105c or data derived from the measurements of physical variables of an operation of the induction motor. Examples of such physical variables include currents and/or voltages of a motor moving a mass. A time series sample can be single- or multi-dimensional, i.e., one sample can include measurements of different physical quantities of the operation of the induction motor.

In some implementations, a human machine interface (HMI) 110 within the system 100 connects the system to a keyboard 111 and pointing device 112, wherein the pointing device 112 can include a mouse, trackball, touchpad, joy stick, pointing stick, stylus, or touchscreen, among others. Through the interface 110 or NIC 150, the system 100 can receive data, such as measurements of operation of the induction motor 101, and/or anomaly detection and fault classification thresholds.

The system 100 includes an output interface 116 configured to output the results of the anomaly detection and/or fault classification of the operation of the induction motor. For example, the output interface can include a memory to render the results of anomaly detection and fault classification. For example, the system 100 can be linked through the bus 126 to a display interface 180 adapted to connect the system 100 to a display device 185, such as a computer monitor, camera, television, projector, or mobile device, among others. The system 100 can also be connected to an application interface 160 adapted to connect the system to equipment 165 for performing various operations. The system 100 can also be connected to a control interface 170 adapted to connect the system to the induction motor 101. For example, through the control interface 170, the system 100 can be configured to control the induction motor 101 based on results of anomaly detection and classification.

The system 100 includes a processor 120 configured to execute stored instructions, as well as a memory 140 that stores instructions that are executable by the processor. The processor 120 can be a single core processor, a multi-core processor, a computing cluster, or any number of other configurations. The memory 140 can include random access memory (RAM), read only memory (ROM), flash memory, or any other suitable memory systems. The processor 120 is connected through the bus 106 to one or more input and output devices. These instructions implement a method for detecting and/or classifying an anomaly in the operation of the induction motor 101.

Some embodiments are based on recognition that the presence of the fault current at a specific fault frequency is indicative of a type of the fault. However, a magnitude of the fault current at the specific fault frequency is not necessarily indicative of the severity of the fault. This is because the magnitude varies in dependence of the load on the motor and motor speed. So, for the same severity of the fault, different magnitudes of the fault current can be detected. However, some embodiments are based on realization that the magnitude of air gap variations between a stator and a rotor of the induction motor caused by the fault is indicative of a severity of the fault in the induction motors regardless of the type of the induction motor, while frequency of the air gap variations are indicative of the type of the fault. Indeed, the bigger the magnitude of the variation of the air gap with respect to the normal (constant) value of the air gap, the bigger the severity of the fault. In addition, some embodiments recognized that for the same type of fault and the same severity of the fault, the air gap variations are the same or at least similar for different types of the induction motors. Therefore, the determination of the air gap variations can serve as an indicator of the severity of the fault. To that end, regardless of the types of the motor or load acting on the motor, the magnitude variations of the air gap are indicative of the severity and independent from the load and type of the motor. However, the air gap variations are difficult and/or expensive to measure.

Some embodiments are based on recognition that the magnitude of the air gap can be determined through magnitude of mutual inductance. Specifically, variations of the air gap can be determined using a transfer function of the variation of the mutual inductance. In addition, the mutual inductance is relevant to magnitude of the fault current through the qualitative electrical model of the motor. As a result, some embodiments convert the fault current into indication of the magnitude of air gap variation without additional sensors and compare air gap variation with threshold determined in advance to estimate the severity. For example, the indication of the magnitude of air gap variation can be the variation of the mutual inductance and/or the actual value of the air gap variation.

Some embodiments are based on recognition that to use the variation of mutual inductance as an indication of an air gap variation, the variation of the mutual inductance due to the fault needs to be separated from other causes of the mutual inductance variations. Hence, there is a need to accurately estimate characteristics of the fault current. Some embodiments are based on recognition that even with the complete knowledge of the stator current, it is challenging to accurately extract the characteristic fault current due to its magnitude is relatively small, typically 30-40 dB lower, and can be even 50 dB lower than that of the fundamental frequency current. However, to estimate the mutual inductance variation from the faulty current, the faulty current needs to be accurately extracted from the measured stator current.

Some embodiments are based on recognition that for specific types of faults there are specific values of the frequency of the fault current. Such a frequency is reference herein as a faulty frequency. For different types of the bearing fault there are different values of the faulty frequency. For example, in some embodiments there are four different faulty frequencies for four different types of fault of the induction motor. To that end, some embodiments determine a set of frequency filters and a set of corresponding quantitative models for the specific values of the faulty frequencies. Each frequency filter is configured to extract a fault current of a fault frequency from the stator current, and each quantitative model is configured to relate the fault current of the fault frequency to a mutual inductance variation for the fault frequency. In such a manner, the accuracy of estimation of the mutual inductance variation increases without the need for a learning stage or additional sensors.

To that end, a memory 140 of the system 100 is configured to store a set of filters 131. Each filter 131 is configured to extract a fault current of a fault frequency from the stator current 195. The filter 131 is also referred herein as a fault frequency filter, which is designed for a specific value of a fault frequency. For example, the set of fault frequency filters 131 includes a first filter to extract a first fault current of a first fault frequency and a second filter to extract a second fault current of a second fault frequency. In one embodiment, there are up to five different faulty frequency filters for five different types of fault of the induction motor 101.

The memory 140 is also configured to store a set of quantitative models 133. Each quantitative model is configured to relate the fault current of the fault frequency to a mutual inductance variation for the fault frequency. For example, the set of quantitative models includes a first quantitative model to relate a magnitude of the first fault current to a first mutual inductance variation for the first fault frequency and a second quantitative model to relate the second fault current to a second mutual inductance variation for the second fault frequency.

The memory 140 is also configured to store at least one fault severity classifier 135 for estimating a severity of the bearing fault in the induction motor for each of the fault frequency based on the mutual inductance variation for the fault frequency. For example, the fault severity classifier 135 can use or can be implemented as a set of thresholds of values of a function of the mutual inductance variation indicative of the severity of the bearing fault in the induction motor. In some implementations, the function is a transfer function relating the mutual inductance variation to a corresponding air gap variation. Additionally, or alternatively, the set of thresholds can be determined for the values of the mutual inductance variation indicative of the severity of the fault.

To that end, some embodiments perform estimation of severity of different types of bearing faults in an induction motor in a frequency domain segmented for predetermined types of bearing faults. For example, each filter is configured in a frequency domain for a specific fault frequency predetermined based on the type of the fault. Similarly, the quantitative models are configured for the same predetermined fault frequencies. In some embodiments, each pair of a filter and a quantitative model determined for the same fault frequency form a separate detector. Segmented frequency domain allows to fine tune the filters and the quantitative models to increase the accuracy of mutual inductance estimation without the need for additional sensors.

In some embodiments, measurements of the stator current are performed by sensors 105a, 105b, and 105c with frequency dependent on the fault frequencies. For example, the measurements of the stator current are sampled with a sampling rate of at least twice of the first fault frequency, if the first fault frequency is greater than the second fault frequency, or sampled with a sampling rate of at least twice of the second fault frequency, if the second fault frequency is greater than the first fault frequency. In such a manner, the complexities of the measurements are adjusted for different types of induction motor.

Figure 1C:
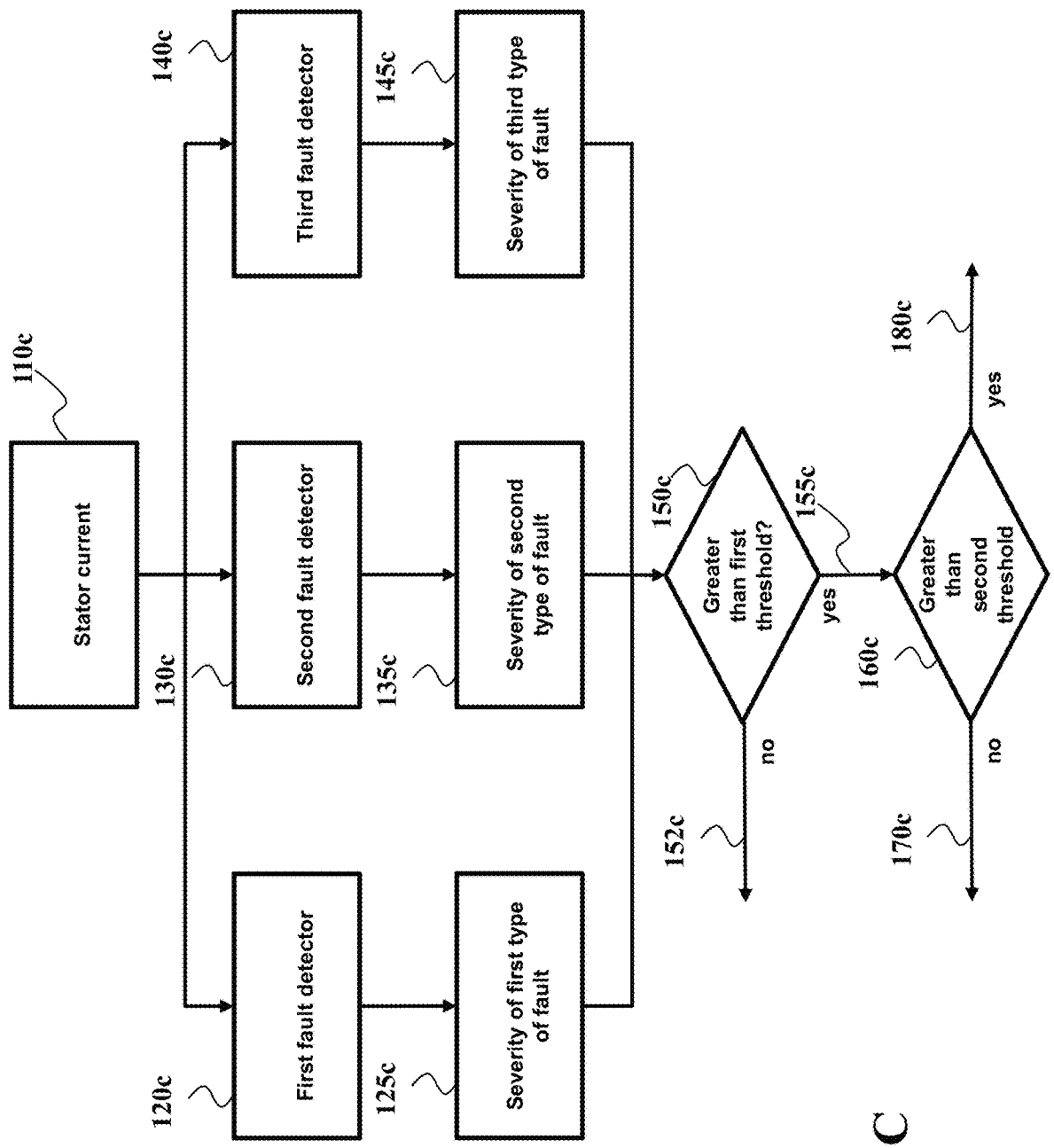
FIG. 1C shows a schematic of fault estimation in segmented frequency domain according to some embodiments.

FIG. 1C shows a schematic of fault estimation in segmented frequency domain according to some embodiments. Each fault detector is designed for a specific fault frequency to process stator current 110c to estimate if there is a fault on that specific fault frequency with a specific fault severity. Each specific fault frequency corresponds to a specific type of fault of the induction motor 101. For example, a first fault detector 120c is configured to estimate severity 125c of the first type of fault, i.e., the fault associated with the first frequency. For example, the first frequency corresponds to the rolling element hitting the outer raceway fault, such that the severity of the first fault indicates a degree or size of the outer raceway defect. For example, smaller value of severity can indicate a small spall on the surface of the bearing raceway, while higher value of severity can indicate a crack.

Similarly, a second fault detector 130c is configured to estimate severity 135c of the second type of fault, i.e., the fault of the second frequency, and a third fault detector 130c is configured to estimate severity 145c of the third type of fault, i.e., the fault of the third frequency. The system 100 can have as many fault detectors as necessary.

In some embodiments, the severity classifier 135 compares the severity of each fault determined by each fault detector with a set of thresholds. The set of thresholds can be unique for each detector or common for some or all of them. For example, one embodiment compares 150c the severity 125c with a first threshold. If the severity 125c is less than the first threshold, there is no first fault 152c, e.g., no raceways are spalled or cracked. Otherwise 155c, the embodiment compares 160c the severity 125c with a second threshold to make a conclusion on the first type of fault. For example, if the severity of the first type of fault 125c is less 170c than the second threshold, the outer raceway of the bearing is spalled and indication of that is rendered by the output interface 116. Otherwise 180c, the outer raceway is cracked and the output interface 116 can be used to control the induction motor, e.g., command to stop the operation of the motor. Similarly, the severities 135c and 145c are compared with the same or different thresholds to draw a conclusion about the second and/or third types of faults. In addition, in various embodiments the number of thresholds can vary based on desired sensitivity of fault estimation.

Figure 1D:
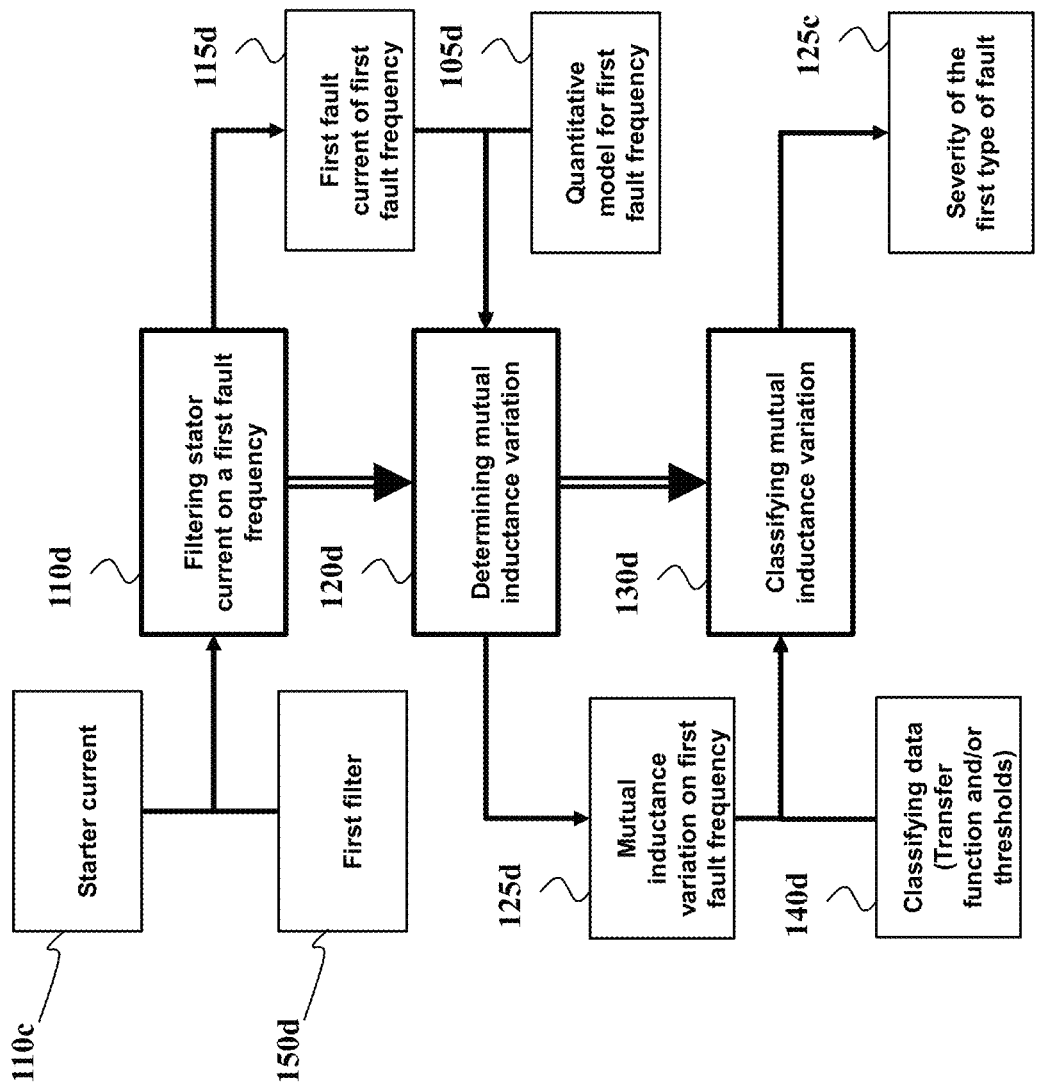
FIG. 1D shows a block diagram of an operation of the first fault detector according to one embodiment.

FIG. 1D shows a block diagram of an operation of the first fault detector 120c according to one embodiment. Other fault detectors operate in a similar manner. The first fault detector 120c is executed by the processor 120 of the system 100. Upon receiving the measurements of the stator current 110c, the embodiment extracts 110d the first fault current 115d from the stator current 110c using the first filter 150d, determines 120d the first mutual inductance variation 125d from the first fault current 115d using the first quantitative model 105d, and compares 130d the transfer function of the first mutual inductance variation 125d with at least one threshold 140d from the set of thresholds to classify the severity 125c of the first type of fault in the induction motor.

In some embodiments, the thresholds 140d are determined for the mutual inductance variations. In one embodiment, the threshold values are defined based on prior bearing malfunction data or experience to simplify the classification. In alternative embodiments, the mutual inductance variation thresholds are transformed from the predefined maximum tolerable air gap variations by the transfer function 140d. This embodiment is advantageous for determining thresholds that have physical meaning for induction motor engineers. In such a manner, during the operation of the motor, some embodiments compare the mutual inductance variation for each of the fault frequency against predetermined thresholds to determine both the type of the fault and the severity of the fault when the transfer function of the mutual inductance variation for a specific faulty frequency is above a threshold.

Problem Overview

Figure 2A:
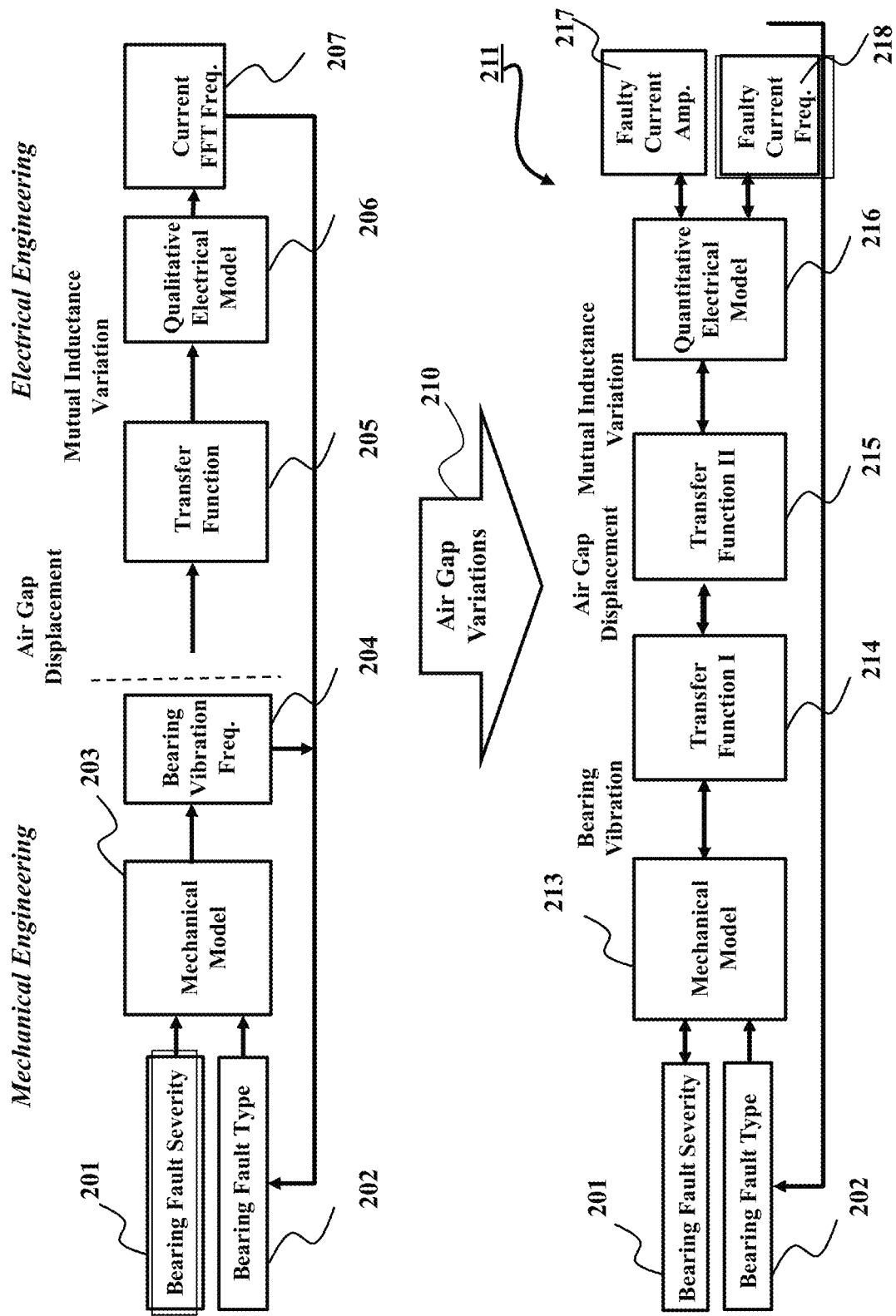
FIG. 2A shows a schematic of a transformation of a multi-physic model used by some embodiments to detect the severity of different types of faults in an induction motor.

FIG. 2A shows a schematic of a transformation of a multi-physic model used by some embodiments to detect the severity of different types of faults in an induction motor. From mechanical point of view, when a bearing fault appears on certain locations that characterizes its bearing fault type 202 with a certain fault severity 201, some vibration pulses are generated by the impacts between the rolling elements and the bearing raceways with a mechanical characterization frequency $f_c$ 204 solely determined by its fault type 202, which includes one or a combination of a cage defect hitting the inner/outer bearing raceways, an inner/outer raceway defect hitting the rolling elements, and a rolling element defect hitting the raceways. The mechanical mechanism for generating such vibrations can be constructed as a Mechanical Model 203, which can be defined with analytical equations or finite element analysis. While the relationship between a bearing fault type and its associated vibration frequency is already well-known, how the vibration signal intensity would change with bearing faults of different size or severity is still under investigation.

Figure 2B:
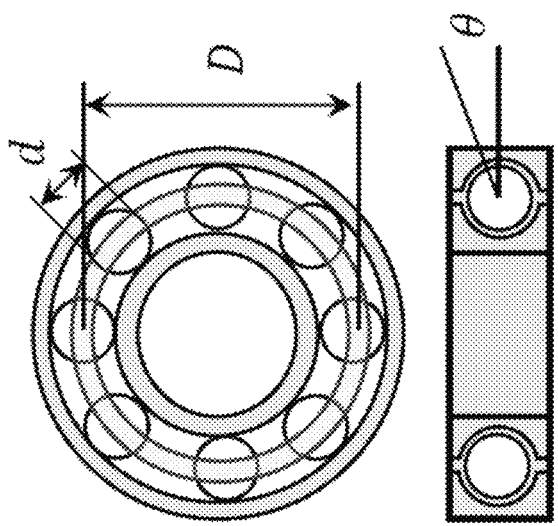
FIG. 2B shows a structure of a rolling-element bearing and the parameters used to describe its geometrical features according to some embodiments.
Figure 2B:
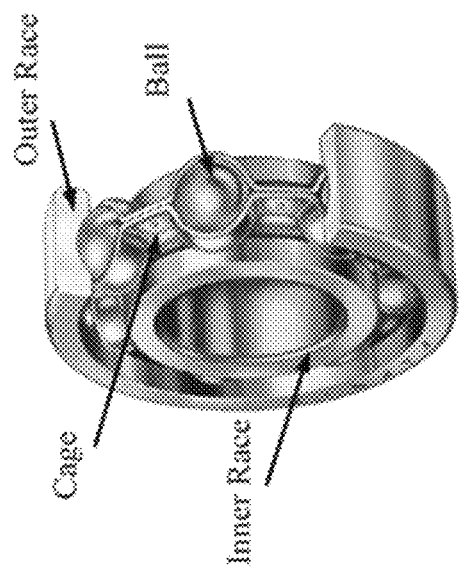

FIG. 2B shows a structure of a rolling-element bearing and the parameters used to describe its geometrical features according to some embodiments. Different types of faults can occur in a bearing, such as a cage defect, an outer race defect, an inner race defect, and a ball defect. Some embodiments, for each fault type considered, define the fault frequency $f_c$ using mechanical characteristic of the geometry and rotation of the bearing using following expressions:

$$\text{Cage defect hits outer race: } f_{co} = \frac{f_r}{2}\left(1 - \frac{d}{D}\cos\theta\right)$$

$$\text{Cage defect hits inner race: } f_{ci} = \frac{f_r}{2}\left(1 + \frac{d}{D}\cos\theta\right)$$

$$\text{Outer race defect hits balls: } f_o = N_b \frac{f_r}{2}\left(1 - \frac{d}{D}\cos\theta\right)$$

$$\text{Inner race defect hits balls: } f_i = N_b \frac{f_r}{2}\left(1 + \frac{d}{D}\cos\theta\right)$$

$$\text{Ball defect hits both races: } f_b = \frac{D}{d} f_r \left(1 - \frac{d^2}{D^2}\cos^2\theta\right)$$

where the number of balls is denoted as $N_b$, the ball diameter is d, and the pitch or cage diameter is D. The point of contact between a ball and the raceway is characterized by the contact angle $\theta$, and $f_r$ is the rotor mechanical speed.

The vibration signal can further induce motor speed/torque oscillations and a periodic air gap displacement, which can be reflected as a periodic variation of the mutual inductance of the same frequency by a transfer function 205. Due to this mutual inductance change with a characterization fault frequency $f_c$. The frequency component of the stator current at $|f_s \pm nf_c|$ will also increase as a response to the bearing fault, where $f_s$ is the fundamental frequency of the input voltage, and the mechanism of which can be formulated as a Qualitative Electrical Model 206. Some embodiments are based on recognition that it is possible to measure and extracted the characterization frequency component 207 from the stator current to detect the presence of a bearing fault and its fault type 202. However, the qualitative electrical model 206 is not able to estimate the size or severity of such a fault, either from vibration signals or from stator current signals.

Some embodiments are based on realization that air gap variations 210 can connect the mechanical and electrical part of the multi-physics model of induction motors to provide an integrated multi-physics model 211 suitable to estimate both the bearing fault type and fault severity. Indeed, the air gap variations 210 can cause or be caused by the vibration of mechanical part of the model as well as mutual inductance variation of an electrical part of the model. In addition, the magnitude of air gap variations between a stator and a rotor of an induction motor caused by the fault is indicative of a severity of the fault 201 in the induction motors regardless of the type of the induction motor, while frequency of the air gap variations is indicative of the type of the fault.

In such a manner, the input to the integrated multi-physics model 211 includes faulty current amplitudes 217 with fault frequencies 218 jointly determined by the bearing geometry and the instantaneous motor speed. Then the mutual inductance variation can be estimated with the developed quantitative electrical model 216, which can be further transformed into an air gap displacement signal with a Transfer Function II 215 that formulates the pattern of vibration signals as pulse trains. With the knowledge of the bearing mounting positions on the shaft relative to the center of the air gap, the vibration intensity at the bearing locations can be inferred by a Transfer Function I 214 based on either complex beam theories or simple linear decay functions of mechanical vibrations. The mechanical model 214 can be constructed as direct analytical relationships between vibration signal pattern and bearing fault size/severity 201, or identify the fault severity 201 with interpolation if its reverse function does not exist, or perform reverse mapping for bearing defects with irregular shapes so that its corresponding analytical equations are difficult to formulate. The type of a bearing fault 202 still can be inferred from its associated faulty current frequency 218.

Figure 2C:
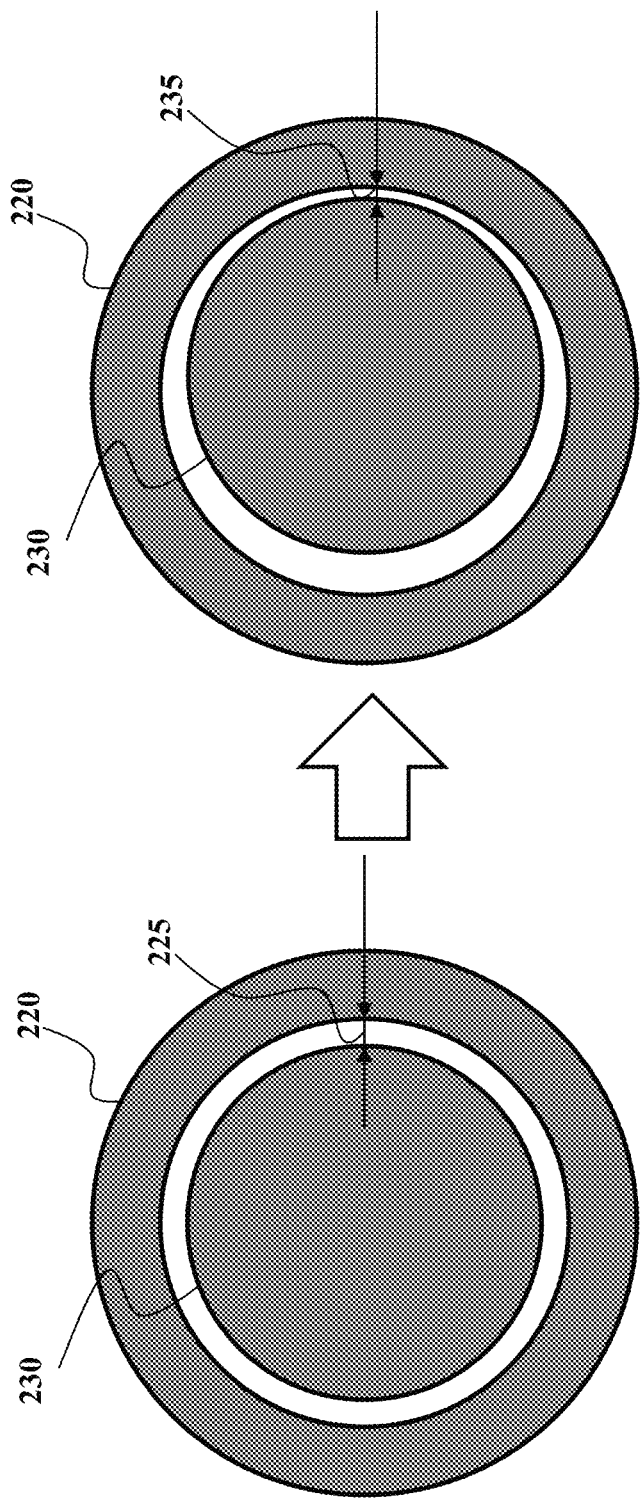
FIG. 2C shows a schematic illustrating an air gap variation used by some embodiments.

FIG. 2C shows a schematic illustrating an air gap variation used by some embodiments. An air gap is a distance 225 between a stator 220 and a rotor 230. Due to fault in the induction motor, the air gap may change 235. The air gap variation is a difference between a value of an air gap 225 of the induction motor without fault and the displaced air gap 235 of the induction motor with fault. In other words, the air-gap variation in an induction motor is the condition of the unequal air-gap between the stator and rotor, such that the radial force from the load or friction pulls the rotor away from the stator bore center. The fault can result from a variety of sources such as stator core ovality, incorrect positioning of the rotor or stator at the time of assembly, incorrect bearing positioning during assembly, worn bearings, shaft deflections and so on. In general, there are several forms of air-gap variations: static air gap variations, where the rotor is displaced from the stator bore center but is still turning upon its own axis, dynamic air gap variations, where the rotor is still turning upon the stator bore center but not on its own center, and a combination thereof.

Some embodiments are based on recognition that different types of fault results in different types of air gap variations. Different types of air gap variations cause different types of mutual inductance variations. Different types of mutual inductance variations cause different fault frequencies. By detecting the fault frequency, it is possible to reverse these relationships to reveal the severity of different types of fault. However, estimating fault frequencies can be challenging.

Figure 2E:
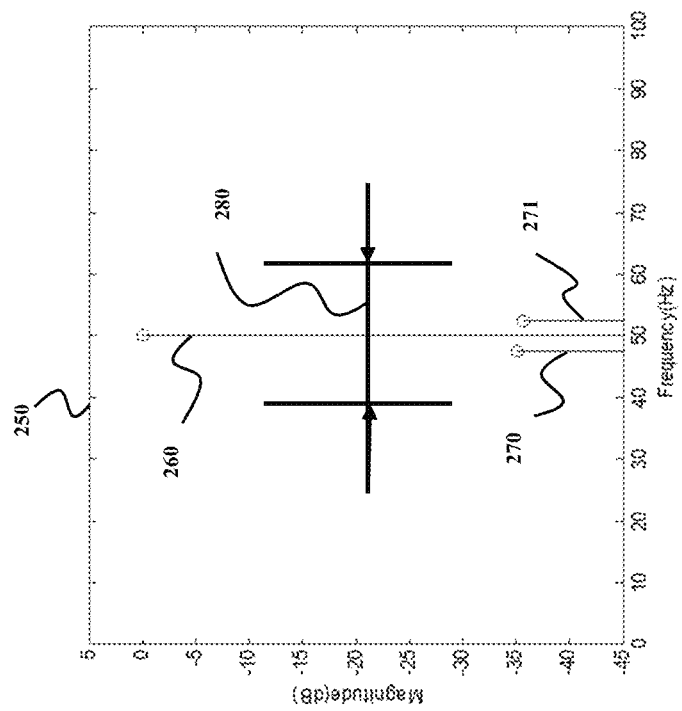
FIG. 2E shows the plot 250 of the signal in the frequency domain in the presence of the fault according to some embodiments.
Figure 2D:
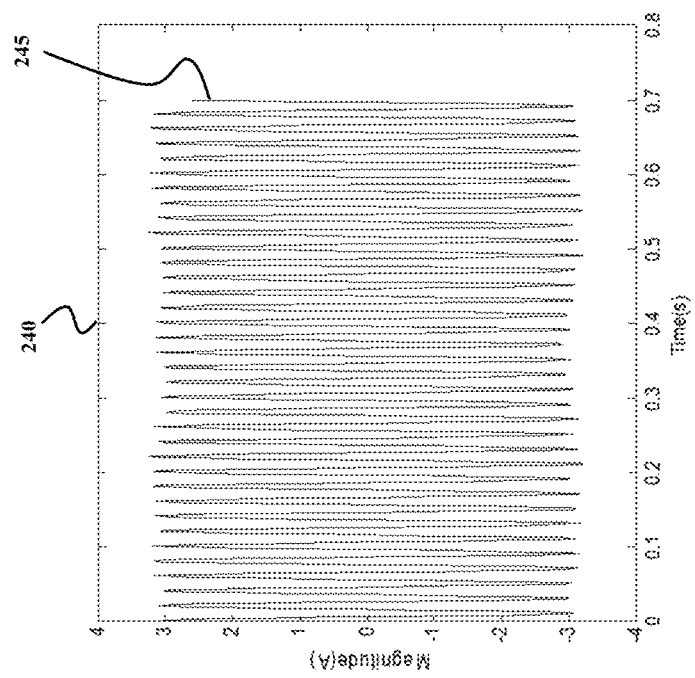
FIG. 2D shows an exemplar plot 240 in a time domain of a signal of a stator current powering the induction motor according to some embodiments.

FIG. 2D shows an exemplar plot 240 in a time domain of a signal 245 of a stator current powering the induction motor according to some embodiments. FIG. 2E shows the plot 250 of the signal in the frequency domain in the presence of the fault according to some embodiments. When there exists a fault in the induction motor, the rotor operates asymmetrically, inducing a fundamental frequency component 260 and extra fault frequency components 270, 271 $f_{sb}= (f_s \pm k f_c \pm m f_r)$ in the stator current, where $f_s$ is the fundamental frequency of the power supply, $f_c$ is the mechanical characteristic fault frequency, $f_r$ is the mechanical rotor frequency, k=1, 2, 3 . . . are the harmonic frequency index, and m=0, 1, 2, 3 . . . are nonnegative integers.

Compared to fundamental frequency component 260, the magnitudes of the fault frequency components 270 or 271 are generally very small, in which the $(f_s \pm f_c)$ component are the strongest pair and can be treated as the indicator of the fault. The frequency $(f_s \pm f_c)$ is referred herein as electric frequency of the fault component or the fault frequency. Some embodiments determine the fault in the induction motor via motor current signature analysis (MCSA) by detecting the electrical characteristic frequency component $(f_s \pm f_c)$.

However, it is challenging to detect the electrical characteristic component due to the following factors. First, the magnitude of electrical characteristic frequency is relatively small, typical 30~40 dB lower than that of the fundamental power supply frequency. Second, the electrical characteristic frequency $(f_s \pm f_c)$ can be close to the power supply frequency $f_s$, i.e., the fundamental frequency 260 and the fault frequency 270 or 271 are within a sub-band or a range 280. For example, under steady operating condition with a low speed or the induction motor is designed to have a high pole count, a bearing cage to inner race fault may have a mechanical characteristic frequency $f_c$ smaller than 5 Hz, so the frequency difference between the electrical characteristic frequency $(f_s \pm f_c)$ and the fundamental frequency $f_s$ can be smaller than 5 Hz, making it difficult to distinguish the electrical characteristic frequency from the fundamental frequency. In this disclosure, the term "electrical characteristic frequency" is referred to $(f_s \pm f_c)$ while the mechanical characteristic frequency is referred to $f_c$, to avoid ambiguity.

In such situations, the extension of the sampling time, e.g., 10-15 sec, can help increase the resolution of signal reconstruction. However, such an extension requires near constant load to ensure that motor current remain stable during the whole measurement period. This constant load requirement in many cases can be troublesome because the unavoidable load fluctuation in reality, especially over a long measurement period.

In addition, even if fault frequency magnitude would be larger, it is still challenging to precisely determine the fault frequency by the Fast Fourier Transform (FFT) since the electrical characteristic fault frequencies $(f_s \pm f_c)$, which depend on the motor speed, in most cases would not be an integer, giving rise to further problems on re-selecting the appropriate FFT window length each time the motor speed is changed.

Solution Overview

Figure 3:
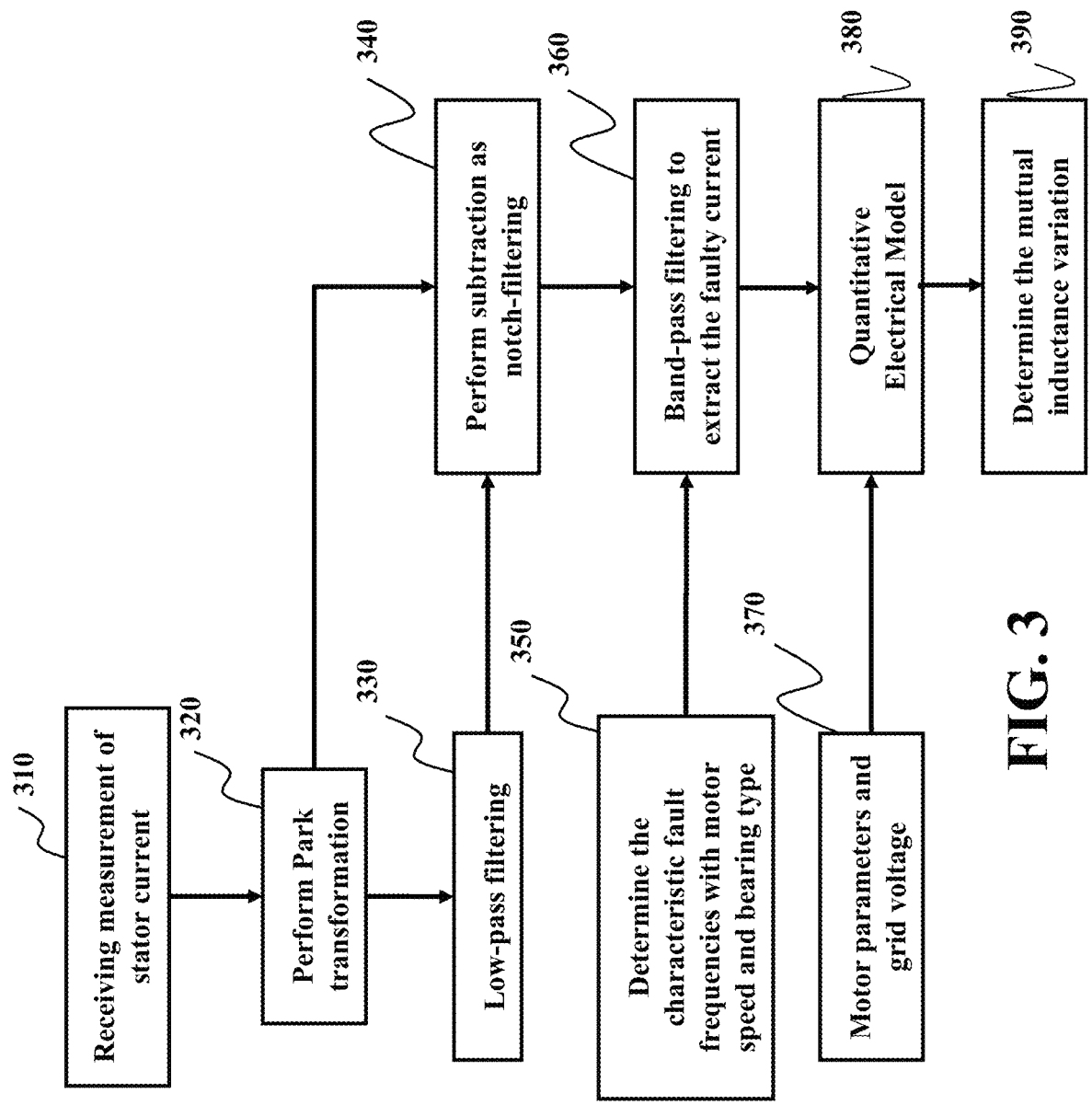
FIG. 3 is a flow diagram of a signal processing method generating the input faulty current to a Quantitative Electrical Model for estimating the mutual inductance variation in a mains-fed induction machine according to some embodiments.

FIG. 3 is a flow diagram of a signal processing method generating the input faulty current to a Quantitative Electrical Model 380 for estimating the mutual inductance variation in a mains-fed induction machine according to some embodiments. The embodiment uses 310 measurements of stator current fed into an induction machine in a time domain. For an induction machine with n phases, only n−1 phase current measurements are required since the current for the $n^{th}$ phase can be calculated with Kirchhoff's current law. With the complete knowledge of the stator current, however, it is challenging to accurately extract the characteristic fault current due to its magnitude is relatively small, typically 30-40 dB lower, and can be even 50 dB lower than that of the fundamental frequency current.

One alternative signal processing approach that replaces FFT according to the embodiments of the invention is described as follows. The Park Transformation 320 is applied upon the measured stator currents to obtain the direct and quadrature axis current, then the largest fundamental AC components in the stator current is transformed into DC values, which can be easily filtered out from the original direct and quadrature current by performing low-pass filtering 330 and subtraction, and this process can be also denoted as notch-filtering 340. The embodiment determines the set of electrical characteristic fault frequency pairs ($f_s \pm f_c$) 350 using bearing geometric parameters and real-time motor speed. The multiple frequency pairs are set as the bandpass frequencies to design multiple band-pass filters 360 to extract the faulty current from the current signals after notch-filtering 340. With the knowledge of motor parameters and the grid voltage 370, the embodiment takes the root sum squared value of the direct and quadrature axis currents after band-pass filtering 360 as the input faulty current to be evaluated by the Quantitative Electrical Model 380, in order to determine the mutual inductance variation 390.

The Quantitative Electrical Model 380 is developed to estimate the mutual inductance variation 390 from the input faulty current according to embodiments of this invention. The response to bearing faults can be considered as a combination of the mutual inductance variations due to the induced air gap fluctuations and the torque oscillations due to the increased harmonics in the stator current that would further lead to speed oscillations. For most induction machine setups, however, the mechanical inertia is large enough to suppress the speed oscillation, and thus this effect is neglected in the later model development.

The mathematical model for squirrel-cage induction machines in the stationary reference frame with a rotational speed of 0 can be expressed as $$\begin{cases} u_{ds} = R_s i_{ds} + p\lambda_{ds} \\ u_{qs} = R_s i_{qs} + p\lambda_{qs} \\ 0 = R_r i_{dr} + p\lambda_{dr} + \omega_r \lambda_{qr} \\ 0 = R_r i_{qr} + p\lambda_{qr} - \omega_r \lambda_{dr} \end{cases} \quad (1)$$

$$\begin{cases} \lambda_{ds} = L_s i_{ds} + L_m i_{dr} \\ \lambda_{qs} = L_s i_{qs} + L_m i_{qr} \\ \lambda_{dr} = L_m i_{ds} + L_r i_{dr} \\ \lambda_{qr} = L_m i_{qs} + L_r i_{qr} \end{cases} \quad (2)$$

where u is the input voltage, R and L are the motor resistance and inductance, $\omega_r$ is the synchronous speed and the electrical rotor speed, $\lambda$ is the flux linkage, p is the differential operator, subscripts d and q represent the direct and quadrature axes, and subscripts s, r and m denote the stator, rotor, and their mutual electromagnetic parameters. The parameters in bold representations are vectors with both an amplitude (with a phasor) and a rotational speed, i.e., $u_{ds} = u_{ds} e^{-i\omega_e t}$, where $\omega_e$ is the synchronous speed.

A matrix form of the above equation can be written as $$\underbrace{\begin{bmatrix} u_{ds} \\ u_{qs} \\ 0 \\ 0 \\ 0 \\ 0 \\ 0 \\ 0 \end{bmatrix}}_{U} \cdot e^{-i\omega_e t} = \underbrace{\begin{bmatrix} 0 & 0 & 0 & 0 & R_x & 0 & 0 & 0 \\ 0 & 0 & 0 & 0 & 0 & R_x & 0 & 0 \\ 0 & 0 & 0 & \omega_r & 0 & 0 & R_x & 0 \\ 0 & 0 & -\omega_r & 0 & 0 & 0 & 0 & R_y \\ -1 & 0 & 0 & 0 & L_x & 0 & L_m & 0 \\ 0 & -1 & 0 & 0 & 0 & L_x & 0 & L_m \\ 0 & 0 & -1 & 0 & L_m & 0 & L_r & 0 \\ 0 & 0 & 0 & -1 & 0 & L_m & 0 & L_r \end{bmatrix}}_{P^{(0)}} \cdot \quad (3)$$

$$\begin{bmatrix} \lambda_{ds} \\ \lambda_{qx} \\ \lambda_{dr} \\ \lambda_{qc} \\ i_{ds} \\ i_{qs} \\ i_{dr} \\ i_{qr} \end{bmatrix} \cdot e^{-i\omega_e t} + \begin{bmatrix} I & 0 \\ \hline 0 & 0 \end{bmatrix}_K p \left\{ \underbrace{\begin{bmatrix} \lambda_{ds} \\ \lambda_{qx} \\ \lambda_{dr} \\ \lambda_{qc} \\ i_{ds} \\ i_{qs} \\ i_{dr} \\ i_{qr} \end{bmatrix}}_{X^{(0)}} \cdot e^{-i\omega_e t} \right\}$$

where U is the input, $P^{(0)}$ is the parametric matrix for a healthy induction machine, $X^{(0)}$ is the response matrix in the steady-state containing all the state variables as the flux linkages and currents, and K is the matrix for the first-order derivatives of the state variables.

Consider a bearing fault that leads to a periodic air gap variation, which further leads to a periodic change of the mutual inductance. While the pattern of the periodic air gap variation can be decomposed into a series of Fourier Series, a simplest form is to only take its fundamental component. The model can be formulated with this assumption first, and the final result is the superposition of all the harmonic contents derived in the same manner from the same model. In this scenario, the updated mutual inductance becomes $$L_m^{new} = L_m + \Delta L_m \cos(\omega_c t) \quad (4)$$

Then the new form of matrix P can be updated to $$P = P^{(0)} + \Delta \tilde{P}(t) \quad (5)$$

$$\Delta \tilde{P}(t) = \Delta L_m \cos(\omega_c t) \cdot M \quad (6)$$

$$M = \begin{bmatrix} 0 & 0 \\ \hline 0 & \begin{array}{c|c} I & I \\ \hline I & I \end{array} \end{bmatrix} \quad (7)$$

In the frequency domain, the complete induction machine equation under mutual inductance change can be written as $$\left[ P^{(0)} + \frac{\Delta L_m}{2}(e^{i\omega_c t} + e^{-i\omega_c t})M \right] \cdot \left( X^{(0)} e^{-i\omega_e t} + X^+ e^{-i\omega^+ t} + X^- e^{-i\omega^- t} \right) + \\ \left[ (-i\omega_e) K X^{(0)} e^{-i\omega_e t} + (-i\omega^+) K X^+ e^{-i\omega^+ t} + (-i\omega^-) K X^- e^{-i\omega^- t} \right] = \\ U \cdot e^{-i\omega_e t} \quad (8)$$

where "+" and "−" represent the fault component for a faulty frequency pair $f_s + f_c$ and $f_s - f_c$, where $f_s$ and $f_c$ are the fundamental frequency of the stator voltage and the mechanical bearing fault characteristic frequency, respectively. Therefore, $X^+$ and $X^-$ are the state variable X at frequencies $f_s + f_c$ and $f_s - f_c$.

The complete solutions $X^+$ and $X^-$ for a faulty frequency pair $f_s + f_c$ and $f_s - f_c$ are $$\begin{cases} (P^{(0)} - i\omega^+ K)X^+ + \frac{\Delta L_m}{2} M X^{(0)} = 0 \\ (P^{(0)} - i\omega^- K)X^- + \frac{\Delta L_m}{2} M X^{(0)} = 0 \end{cases} \quad (9)$$

where $X^{(0)}$ is the solution of $$(P^{(0)} - i\omega_e K)X^{(0)} + \frac{\Delta L_m}{2} M(X^+ + X^-) = U \qquad (10)$$

It can be observed that equations (9) and (10) are coupled in terms of $X^+$ and $X^-$ even at different frequency domains. However, since $(X^+ + X^-)$ is generally way smaller than $X^{(0)}$ (the stator current at the fault frequency pairs fs±fc can be around 40 to 50 dB smaller than the rated current at fs), and this term is also getting multiplied with $\Delta L_m$, the elements of which is also way smaller compared to their corresponding elements in matrix $(P(0)-i\omega_e K)$. Therefore, the product of $\Delta L_m$ and $(X^+ + X^-)$ can be viewed as a second-order small-signal term, which can be safely neglected and update equation (10) into the form of $$(P^{(0)} - i\omega_e K)X^{(0)} = U \qquad (11)$$

Since the faulty stator current that can be measured is contained in the state variable matrix X, and matrix $(P^{(0)}-i\omega^{\pm}K)$ is invertible under the context of induction machines, thus the corresponding rows to the stator current in matrix $(P^{(0)}-i\omega^{\pm}K)^{-1}MX^{(0)}$ can be extracted as $A^+$ and $A^-$ depending on $\omega^-$ and $\omega^-$ specified in the model.

Since $\Delta L_m$ is a scalar, the following results can be obtained as $$\begin{cases} |\Delta I^+| = |A^+| \cdot \frac{\Delta L_m}{2} \\ |\Delta I^-| = |A^-| \cdot \frac{\Delta L_m}{2} \\ |\Delta I^+| + |\Delta I^-| = |\Sigma \Delta I| \end{cases} \qquad (11)$$

in which $|\Sigma \Delta I|$ is the magnitude of the faulty current after band-pass filtering 360.

Then the mutual inductance variation can be determined as $$\Delta L_m = 2 \frac{\Sigma \Delta I}{|A^+| + |A^-|} \qquad (12)$$

FIG. 4A, FIG. 4B and FIG. 4C demonstrate the exemplar plots for operation of an embodiment of FIG. 3. For example, FIG. 4A, FIG. 4B and FIG. 4C show a measured stator current of its original form 410, corresponding to the output of 310; its intermediate form 420 after performing Park transformation and low-pass filtering, corresponding to the output of 340; and its final faulty current form 430 after performing subtraction with the original signal, band-pass filtering and taking the root sum squared value of the direct and quadrature axis currents, corresponding to the output of 360. While the majority of the contents of the original stator current measurement 410 is the fundamental frequency component, the magnitudes of the fault frequency component 430 can be very small, or precisely around 50 dB smaller. However, accurately determining the magnitude of the faulty current is essential to estimating the bearing fault severity.

In addition to developing a model for bearing fault severity estimation of induction machines directly connected to the grid, some embodiments also uses a terminal voltage estimation method for those motors controlled by PWM inverters, which also includes the compensation of inverter nonidealities and its switching dead-time. This voltage estimation method is applied in case the inverter switching frequency gets close or even surpasses the maximum sampling frequency of the data acquisition system that resulted in inaccuracies or even errors with direct terminal voltage measurement.

Figure 5:
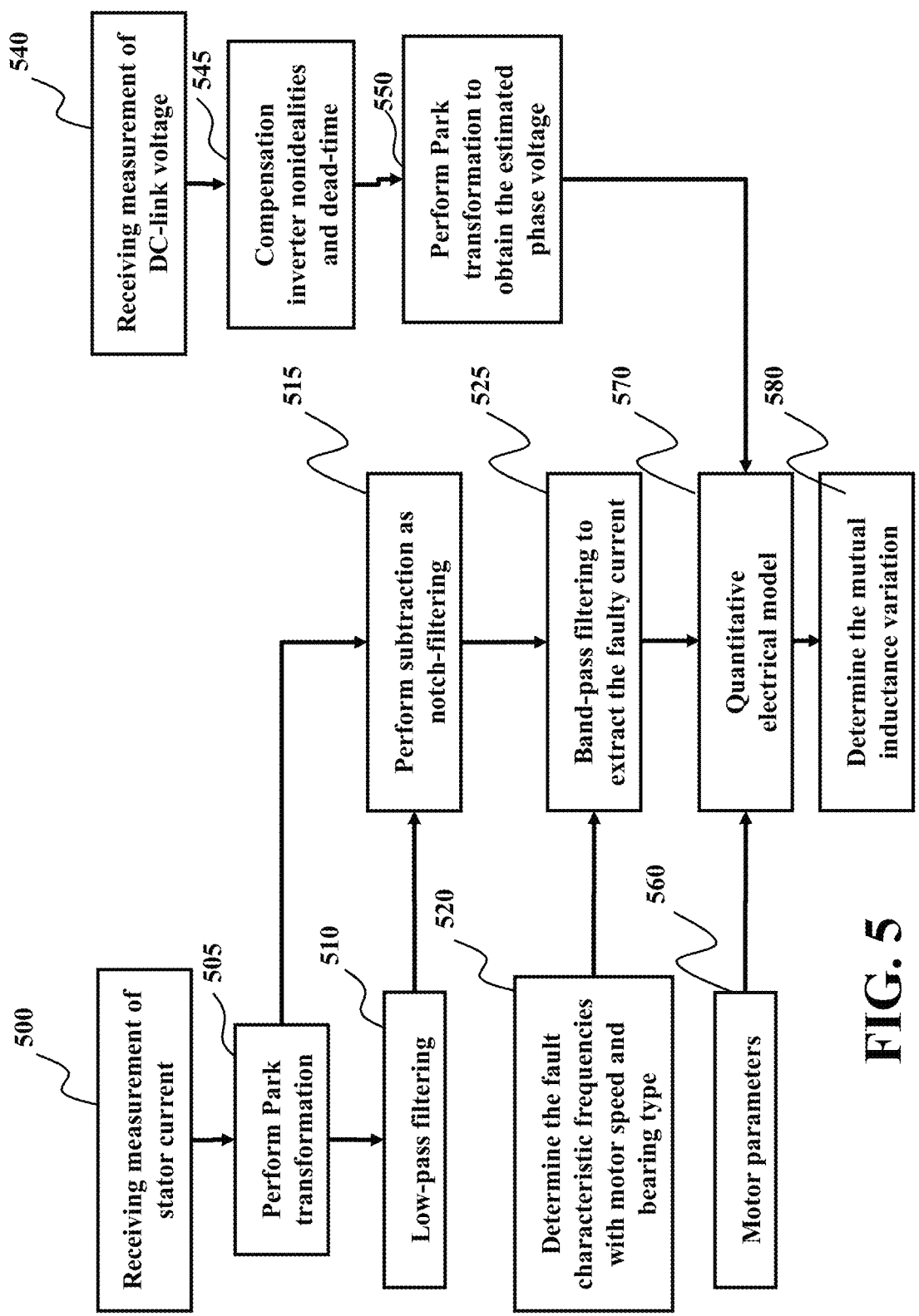
FIG. 5 shows a flow diagram of a signal processing method generating the input faulty current and input voltage to the quantitative electrical model for estimating the mutual inductance variation in an inverter-fed induction machine according to some embodiments.

FIG. 5 shows a flow diagram of a signal processing method generating the input faulty current and input voltage to the quantitative electrical model for estimating the mutual inductance variation in an inverter-fed induction machine according to some embodiments. The embodiment uses n−1 phase measurements of stator current 500 fed into an induction machine in the time domain. The Park Transformation 505 is applied upon the measured stator currents to obtain the direct and quadrature axis current, then the largest fundamental AC components in the stator current is transformed into DC values, which can be easily filtered out from the original direct and quadrature currents by performing low-pass filtering 510 and subtraction, and this process can be also denoted as notch-filtering 515. The embodiment determines the set of electrical characteristic fault frequencies $(f_s \pm f_c)$ 520 using the bearing geometric parameters and real-time motor speed. The multiple frequency pairs are set as the bandpass frequencies to design multiple band-pass filters 525 to extract the faulty current from the current signals after notch-filtering 515.

Since the input voltage are supplied by voltage-source inverters, the shape of the voltage waveforms would resemble the rectangular pulses with variable widths that is alternating at the switching frequency, rather than a simple 50 or 60 Hz sinusoidal voltage from an AC grid. The mechanism of which is commonly referred to as Pulse Width Modulation (PWM). Since the switching frequency can get close or even surpass the maximum sampling frequency of the data acquisition system, it would become unrealistic to accurately measure this PWM voltage with direct measurements. Therefore, the input voltage is rather estimated in this embodiment from the measured DC-link voltage 540 multiplied by the duty cycles generated by the motor control algorithm embedded in the digital signal processors of an inverter. However, due to the dead-time effect and inverter nonidealities, a direct multiplication of the above two variables would be usually inaccurate. Therefore, compensating both inverter nonidealities and dead-time 545 is often needed that requires extra information from the inverter data sheet and the programmable dead-time specified in the firmware control algorithm. Then the direct and quadrature axis currents can be calculated by applying the same Park transformation 550.

Supplemented by the motor parameters 560, this embodiment takes the root sum squared value of the direct and quadrature axis currents after band-pass filtering 525 as the input faulty current, and this embodiment feeds this current to the Quantitative Electrical Model 570 to determine the mutual inductance variation 580.

FIG. 6A, FIG. 6B and FIG. 6C show exemplar plots for estimating mutual inductance variation profile according to some embodiments. For example, a specific bearing defect triggers a series of rectangular pulses for the mutual inductance variation 600, and the centers of the adjacent pulses are $1/f_c$ apart in the time domain, where $f_c$ is the mechanical characteristic bearing fault frequency. Some embodiments are based on recognition that rectangular pulses for the mutual inductance variation can be approximated using a cosine function to simplify the computation.

FIG. 6A, FIG. 6B and FIG. 6C are exemplar plots demonstrating the accuracy improvement of estimating such a rectangular mutual inductance variation profile with the zero and fundamental order cosine function compared to a superposition of cosine harmonic functions up to the $3^{rd}$ order and the $5^{th}$ order, the magnitudes of these mutual inductance variation harmonics are determined by the faulty stator current through the developed Quantitative Electrical Model 570 according to embodiments of the invention. It can be observed in FIG. 6A that a summation of the zero-order and fundamental cosine functions 610 of frequency $f_c$ is able to approximate the rectangular mutual inductance variation pattern with some overshoots at the spike. With the inclusion of higher order harmonic contents, for instance, up to the $3^{rd}$ order 620 or the $5^{th}$ order 630, the mutual inductance variation in the time domain can be estimated with improved accuracy and no significant overshoots in this cumulative manner.

Although the rectangular-shaped pulses are employed in many embodiments to represent the mutual inductance vibration pattern, their exact shape and width are usually difficult to predict and verify. However, this embodiment enables estimating the bearing fault pattern and severity based on the superposition of the Fourier Series terms up to the $n^{th}$ order cosine functions with frequencies up to $nf_c$, while their amplitudes are determined by the faulty stator current 525 of the corresponding frequencies through the Quantitative Electrical Model 570. In this manner, both the width and shape of the mutual inductance variation pulses can be reconstructed with pure electrical stator current information.

In the time domain, the air gap permeance, which is directly proportional to the mutual inductance by a factor of $N^2$, where N is the number of series-connected turns in the stator slot, can be defined as the following form with the presence of a cage to outer race bearing fault as $$\Lambda(t) \approx \Lambda_0\{1+[c_0+2\Sigma_{k=1}^n c_k \cos(2\pi k f_c t)]\}$$

Where $f_c$ is the mechanical characteristic bearing fault frequency, $\Lambda_0$ is the air gap permeance without fault, c0 is the zero-th order Fourier series due to the fault, k is the order number of Fourier series, n is the upper bound for the Fourier series order in this superposition, and $c_k$ is the mutual inductance variation of the $k^{th}$ order obtained from the Quantitative Electrical Model 570.

After applying the Dirac generalized functions and Taylor expansion, the above expression for air gap permeance can be written as $$\Lambda(t) = \Lambda_0 \frac{1}{1-\left[c_0 + \sum_{k=1}^n c_k \cos(2k\pi f_c t)\right]}$$

Transfer Function II is introduced to connect the electrical air gap permeance to the mechanical air gap vibration as $$g(t) = \frac{\mu}{\Lambda(t)} = g_0\left\{1 - \left[c_0 + \sum_{k=1}^n c_k \cos(2k\pi f_c t)\right]\right\}$$

where $\mu$ is the air permeability.

Figure 7A:
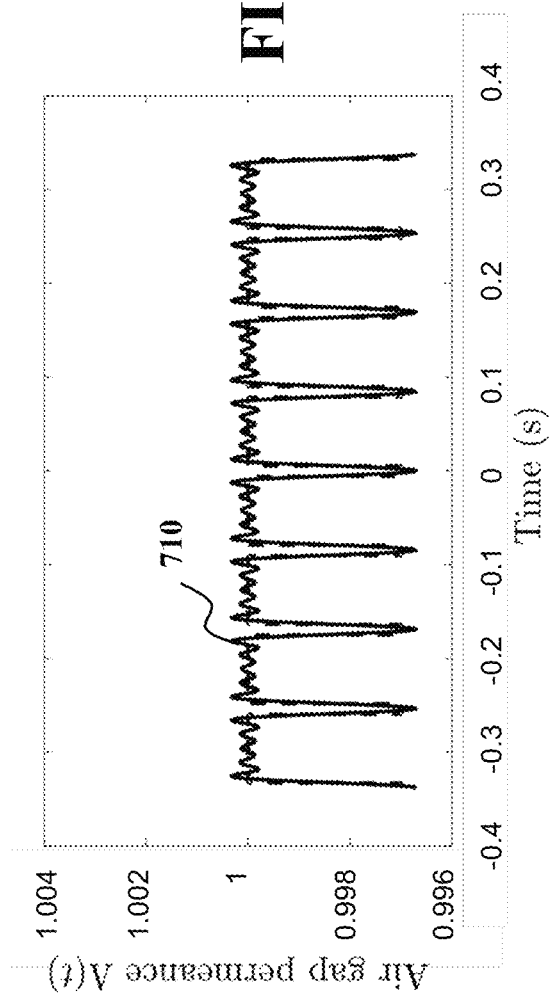
FIG. 7A and FIG. 7B are exemplar plots of the Transfer Function II for determining the normalized air gap variation profile in the time domain with the normalized air gap permeance profile according to some embodiments.
Figure 7B:
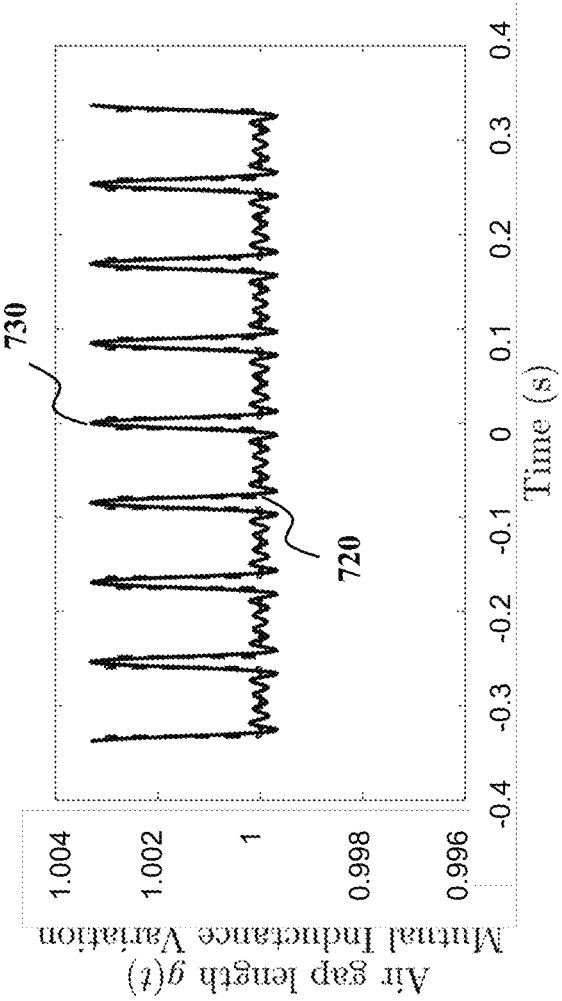

FIG. 7A and FIG. 7B are exemplar plots of the Transfer Function II for determining the normalized air gap variation profile 720 in the time domain with the normalized air gap permeance profile 710 based on the above equation according to some embodiments. The impact of a bearing defect can be considered as an infinite number of pulse trains in the time domain. The maximum variation of the air gap length $g_{max}$ 730 is defined as the maximum air gap length displacement.

With the inclusion of higher order harmonic contents, the cumulative mutual inductance variation in the time domain can be estimated in an improved accuracy, and the reciprocal of which, the air gap length variation, defined as the bearing fault severity, can be also reconstructed with better accuracy.

Figure 8:
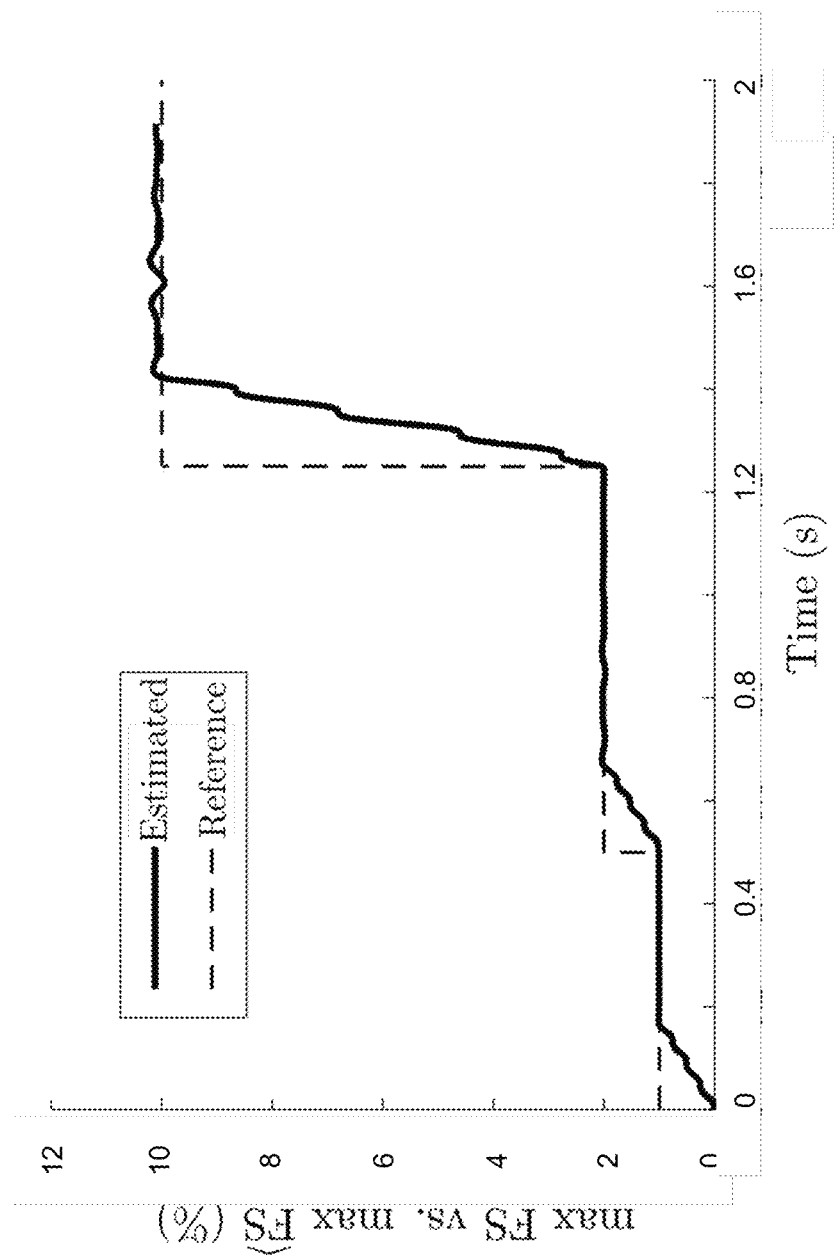
FIG. 8 shows a graph comparing the reference and the estimated maximum bearing fault severity (FS) determined according to some embodiments.

FIG. 8 shows a graph comparing the reference and the estimated maximum bearing fault severity (FS) determined according to some embodiments. Specifically, the graph shows FS vs. $\widehat{FS}$ (%) with accelerated aging study on a rolling element bearing, the fault severity is measured in terms of the percentage change of the variation of the air gap length, which is reconstructed based on the fundamental cosine function according to some embodiments.

An indicator of fault severity (FS) based on the percentage of air gap variation can then be monitored:

$$FS(t)=(g(t)-g_0)/g_0$$

The FS indicator is identified through the Quantitative Electrical Model 570 and the monitored stator current data 500, and compared with a predetermined threshold value, or a set of threshold values to classify the fault severity.

Exemplar Embodiment

Parameter Identification:

One embodiment, to implement the method for bearing fault detection for a given induction machine, first identify the electrical parameters of the machines, the supplied voltage information, and the installed bearing geometrical parameters.

The following electrical parameters are used by the embodiment for the input of the electrical model $$\begin{cases} u_{ds} = R_s i_{ds} + p\lambda_{ds} \\ u_{qs} = R_s i_{qs} + p\lambda_{qs} \\ 0 = R_r i_{dr} + p\lambda_{dr} + \omega_r \lambda_{qr} \\ 0 = R_r i_{qr} + p\lambda_{qr} - \omega_r \lambda_{qr} \end{cases}$$

$$\begin{cases} \lambda_{ds} = L_s i_{ds} + L_m i_{dr} \\ \lambda_{qs} = L_s i_{qs} + L_m i_{qr} \\ \lambda_{dr} = L_m i_{ds} + L_r i_{dr} \\ \lambda_{qr} = L_m i_{qs} + L_r i_{qr} \end{cases},$$

wherein $R_s$: stator resistance, $R_r$: rotor resistance, $L_s$: stator resistance, $L_r$: rotor resistance $L_m$: mutual inductance between stator and rotor, and $\omega_r$: rotor speed For the supply voltage, the information depends on the type of power supply for the machine. When the power is supplied directly from the power grid, the voltage is then the AC grid voltage. For example, with respect to implementations described in relation to FIG. 5, when the power is supplied by voltage-source inverters, the input voltage is estimated from the measured DC-link voltage 540 multiplied by the duty cycles generated by the motor control algorithm embedded in digital signal processors of an inverter. However, because of the dead-time effect and inverter nonidealities, a direct multiplication of the above two variables can be inaccurate. Therefore, compensating both inverter nonidealities and dead-time 545 is often needed that requires extra information from the inverter data sheet and the programmable dead-time specified in the control algorithm. The fundamental frequency of the input voltage $f_s$ is then identified.

For the installed bearing, the geometrical parameters (the number of balls $N_b$, the ball diameter is d, and the pitch or cage diameter is D) and motor rotation frequency $f_r$ need to be known in order to identify the mechanical characteristic fault frequencies according to the expressions:

Cage defect hits outer race: $f_{co} = \frac{f_r}{2}\left(1 - \frac{d}{D}\cos\theta\right)$ Cage defect hits inner race: $f_{ci} = \frac{f_r}{2}\left(1 + \frac{d}{D}\cos\theta\right)$ Outer race defect hits balls: $f_o = N_b \frac{f_r}{2}\left(1 - \frac{d}{D}\cos\theta\right)$ Inner race defect hits balls: $f_i = N_b \frac{f_r}{2}\left(1 + \frac{d}{D}\cos\theta\right)$ Ball defect hits both races: $f_b = \frac{D}{d} f_r \left(1 - \frac{d^2}{D^2}\cos^2\theta\right)$ The frequency components of the stator current to be monitored include the electrical characteristic frequencies at $|f_s \pm n f_c|$, wherein $f_s$ is the fundamental frequency of induction motor, $f_c$ is one of the fault frequencies as identified above, and n is an integer.

Data Acquisition:

After identifying the necessary parameters, measurement data of the stator current in the time domain is needed for the fault detection. For an induction machine with n phases, only n−1 phase current measurements are required since the current for the nth phase can be calculated with Kirchhoff's current law. For commonly used three-phase machines, only two-phase current measurements are required, but some implementations can use the measurements on all three phases.

Signal Processing:

The measured time domain stator current signal is then converted into frequency domain with various signal processing techniques, such as the method proposed in this invention, including steps of Park transformation 505, low-pass filtering 510, and perform subtraction as notch-filtering 515.

Fault Current Signal Extraction:

For each mechanical characteristic fault frequency $f_e$ to be monitored, the step of band-pass filtering 525 is carried out to extract the sum of the fault current amplitude $\Delta I$ at an electrical characteristic fault frequency pair $(f_s \pm f_c)$.

Mutual Inductance Variation Identification:

For each mechanical characteristic fault frequency $f_e$, the sum of the fault current amplitude $\Delta I$ at an electrical characteristic fault frequency pair $(f_s \pm f_c)$, and the electrical parameters of the machine that is identified in step 560 are fed into the Quantitative Electrical Model 570, and the mutual inductance variation $\Delta L_m$ can be identified as:

$$\Delta L_m = 2\frac{\Sigma \Delta I}{|A^+| + |A^-|}$$

where A+ and A− are system matrices of the Quantitative Electrical Model 570 at $(f_s + f_c)$ and $(f_s - f_c)$, respectively.

Air Gap Variation Estimation:

For each mechanical characteristic fault frequency $f_e$, estimate the air gap permeance $\Lambda(t)$ that is directly proportional to the mutual inductance as $$\Lambda(t) = \Lambda_0 \frac{1}{1 - \left[c_0 + \sum_{k=1}^{n} c_k \cos(2k\pi f_c t)\right]},$$

where $c_k$ is the normalized mutual inductance variation $\Delta L_m/L_m$ identified in the earlier step at a fault frequency of $kf_c$, and multiply by a factor of $N^2$, where N is the number of series-connected turns in the stator slot. $f_c$ is the mechanical characteristic bearing fault frequency, $\Lambda_0$ is the air gap permeance without fault, c0 is the zero-th order Fourier series due to the fault, k is the order number of Fourier series, n is the upper bound for the Fourier series order in this superposition.

Based on the identified air gap permeance $\Lambda(t)$, the corresponding air gap variation g(t) is identified according to:

$$g(t) = \frac{\mu}{\Lambda(t)} = g_0\left\{1 - \left[c_0 + \sum_{k=1}^{n} c_k \cos(2k\pi f_c t)\right]\right\},$$

where $\mu$ is the air permeability, $g_0$ is the air gap length without fault, c0 is the zero-th order Fourier series due to the fault, k is the order number of Fourier series, n is the upper bound for the Fourier series order in this superposition.

Fault Severity Estimation and Classification:

An indicator of fault severity (FS) based on the percentage of air gap variation can then be monitored. The FS signal as a function of time can be determined according to $FS(t)=(g(t)-g_0)/g_0$.

The obtained FS signal is then compared with preset threshold values to classify the fault severity for each fault type.

For example, for a rolling element to outer race fault, if 0.25% is set as the threshold value between a healthy bearing and a bearing with a minor fault, and 0.5% is set as the threshold value between a bearing with a minor fault and a bearing with a major fault. Applying all the techniques and methods in this invention, the estimated fault severity and fault classification results are

| Dataset | Estimated fault severity (FS) | Classification results |
|---------|-------------------------------|------------------------|
| A | 0.02% | Healthy |
| B | 0.23% | Minor fault |
| C | 0.56% | Major fault |

Additionally, or alternatively, one embodiment determines FS(t) as a function of air gap permeance, because the air gap permeance can be directly mapped to the air gap variation. In this embodiment, the $FS(t)=(\Lambda(t)-\Lambda_0)/\Lambda_0$.

Additionally, or alternatively, one embodiment determines FS(t) as a function of mutual inductance variation, because the mutual inductance variation can be directly mapped to the air gap permeance. In this embodiment, the $FS(t)=\Delta L_m/L_m$.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine. Typically, the functionality of the program modules may be combined or distributed as desired in various embodiments.

Also, the embodiments of the invention may be embodied as a method, of which an example has been provided. The acts performed as part of the method may be ordered in any suitable way. Accordingly, embodiments may be constructed in which acts are performed in an order different than illustrated, which may include performing some acts concurrently, even though shown as sequential acts in illustrative embodiments.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. A system for estimating a severity of a bearing fault in an induction motor, comprising:
    an input interface configured to accept measurements of a stator current during an operation of the induction motor;
    a memory configured to store a set of filters, each filter is configured to extract a fault current of a fault frequency from the stator current, the set of filters includes a first filter to extract a first fault current of a first fault frequency and a second filter to extract a second fault current of a second fault frequency; and
    a set of quantitative models, each quantitative model is configured to relate the fault current of the fault frequency to a mutual inductance variation for the fault frequency, the set of quantitative models includes a first quantitative model to relate a magnitude of the first fault current to a first mutual inductance variation for the first fault frequency and a second quantitative model to relate the second fault current to a second mutual inductance variation for the second fault frequency; at least one fault severity classifier for estimating a severity of the fault in the induction motor for each of the fault frequency based on the mutual inductance variation for the fault frequency;
    a processor configured, upon receiving the measurements of the stator current, to extract the first fault current from the stator current using the first filter, determine the first mutual inductance variation from the first fault current using the first quantitative model, and classify the first mutual inductance variation with the fault severity classifier to determine the severity of a first type of fault in the induction motor; and extract the second fault current from the stator current using the second filter, determine the second mutual inductance variation from the second fault current using the second quantitative model, and classify the second mutual inductance variation with the fault severity classifier to determine the severity of a second type of fault in the induction motor; and
    an output interface configured to output one or combination of the severity of the first type of fault in the induction motor and the severity of the second type of fault in the induction motor,
    wherein each quantitative model approximates the mutual inductance variation for the fault frequency using Fourier Series of a set of oscillating functions of the fault frequency, wherein a frequency of each oscillating function in the Fourier Series is a multiple of the fault frequency, and an amplitude of each oscillating function in the Fourier Series is a function of a magnitude of the fault current on the fault frequency, such that the first quantitative model approximates the first mutual inductance variation using oscillating functions of multiples of the first fault frequency with amplitudes of the function of the magnitude of the first fault current, and the second quantitative model approximates the second mutual inductance variation using oscillating functions of multiple of the second fault frequency with amplitudes of the function of the magnitude of the second fault current.

2. The system of claim 1, wherein the set of oscillating functions of multiples of the fault frequency is a set of cosine functions of multiples of the fault frequency.

3. The system of claim 2, wherein the set of cosine functions of multiples of the fault frequency includes only a first order cosine function.

4. The system of claim 1, wherein the measurements of the stator current are sampled with a sampling rate of at least twice of the first fault frequency, if the first fault frequency is greater than the second fault frequency, or sampled with a sampling rate of at least twice of the second fault frequency, if the second fault frequency is greater than the first fault frequency.

5. The system of claim 1, wherein to extract the fault current of the fault frequency from the stator current each filter is configured to perform Park transformation of the measurements of the stator current to produce a transformed stator current; filter fundamental components of the stator current from the transformed stator current to produce a stator current residue; and extract the faulty frequency from the stator current residue using a band-pass filter to produce the faulty current of the faulty frequency.

6. The system of claim 1, wherein a transfer function of the mutual inductance variation maps the mutual inductance variation to a permeance of an air gap between a stator and a rotor of the induction motor, such that the set of thresholds specify a set of values of the permeance of the air gap.

7. The system of claim 1, wherein a transfer function of the mutual inductance variation maps the mutual inductance variation to a length profile of an air gap between a stator and a rotor of the induction motor, such that the set of thresholds specify a set of values of the maximum variation in the length profile of the air gap.

8. The system of claim 1, wherein a fault severity classifier compares a transfer function of the first and the second mutual inductance variations with at least one threshold from the set of thresholds to determine the severity of the first and the second type of fault in the induction motor.

9. The system of claim 8, wherein the induction motor does not have the first type of fault when the transfer function of the first mutual inductance variation is less than a first threshold, wherein the induction motor has the first type of fault allowing to continue the operation of the induction motor when the transfer function of the first mutual inductance variation is less than a second threshold, and wherein the processor is configured to stop the operation of the induction motor when the transfer function of the first mutual inductance variation is greater than the second threshold.

10. The system of claim 1, wherein the processor is configured to determine a function of air gap variations in the induction motor, including a function of a frequency of the air gap variations and a function of a magnitude of the air gap variations; determine the type of the fault from the frequency of the air gap variations; and determine the severity of the fault from the magnitude of the air gap variations.

11. A method for estimating a severity of a bearing fault in an induction motor, wherein the method uses a processor coupled to a memory storing a set of filters, each filter is configured to extract a fault current of a fault frequency from the stator current, the set of filters includes a first filter to extract a first fault current of a first fault frequency and a second filter to extract a second fault current of a second fault frequency; a set of quantitative models, each quantitative model is configured to relate the fault current of the fault frequency to a mutual inductance variation for the fault frequency, the set of quantitative models includes a first quantitative model to relate a magnitude of the first fault current to a first mutual inductance variation for the first fault frequency and a second quantitative model to relate the second fault current to a second mutual inductance variation for the second fault frequency; and at least one fault severity classifier for estimating a severity of the fault in the induction motor for each of the fault frequency based on the mutual inductance variation for the fault frequency, wherein the processor is coupled with stored instructions implementing the method, wherein the instructions, when executed by the processor carry out steps of the method, comprising:
  accepting measurements of a stator current during an operation of the induction motor;
  extracting the first fault current from the stator current using the first filter, determining the first mutual inductance variation from the first fault current using the first quantitative model, and classifying the first mutual inductance variation with the fault severity classifier to determine the severity of a first type of fault in the induction motor;
  extracting the second fault current from the stator current using the second filter, determining the second mutual inductance variation from the second fault current using the second quantitative model, and classifying the second mutual inductance variation with the fault severity classifier to determine the severity of a second type of fault in the induction motor; and
  outputting one or combination of the severity of the first type of fault in the induction motor and the severity of the second type of fault in the induction motor,
  wherein a transfer function of the mutual inductance variation maps the mutual inductance variation to a permeance of an air gap between a stator and a rotor of the induction motor, such that the set of thresholds specify a set of values of the permeance of the air gap.

12. The method of claim 11, further comprising:
  determining a first severity function of air gap variations from the first mutual inductance variation;
  determining a second severity function of air gap variations from the second mutual inductance variation;
  comparing the first and the second severity functions with a set of thresholds to determine severities of the first and the second type of faults.

13. A non-transitory computer readable storage medium embodied thereon a program executable by a processor for performing a method, the storage medium stores a set of filters, each filter is configured to extract a fault current of a fault frequency from the stator current, the set of filters includes a first filter to extract a first fault current of a first fault frequency and a second filter to extract a second fault current of a second fault frequency; a set of quantitative models, each quantitative model is configured to relate the fault current of the fault frequency to a mutual inductance variation for the fault frequency, the set of quantitative models includes a first quantitative model to relate a magnitude of the first fault current to a first mutual inductance variation for the first fault frequency and a second quantitative model to relate the second fault current to a second mutual inductance variation for the second fault frequency; and at least one fault severity classifier for estimating a severity of the fault in the induction motor for each of the fault frequency based on the mutual inductance variation for the fault frequency, the method comprising:
  accepting measurements of a stator current during an operation of the induction motor;
  extracting the first fault current from the stator current using the first filter, determining the first mutual inductance variation from the first fault current using the first quantitative model, and classifying the first mutual inductance variation with the fault severity classifier to determine the severity of a first type of fault in the induction motor;
  extracting the second fault current from the stator current using the second filter, determining the second mutual inductance variation from the second fault current using the second quantitative model, and classifying the second mutual inductance variation with the fault severity classifier to determine the severity of a second type of fault in the induction motor; and
  outputting one or combination of the severity of the first type of fault in the induction motor and the severity of the second type of fault in the induction motor;
  determining a first severity function of air gap variations from the first mutual inductance variation;
  determining a second severity function of air gap variations from the second mutual inductance variation;
  comparing the first and the second severity functions with a set of thresholds to determine severities of the first and the second type of faults.

14. A system for estimating a severity of a bearing fault in an induction motor, comprising:
  an input interface configured to accept measurements of a stator current during an operation of the induction motor;
  a memory configured to store a set of filters, each filter is configured to extract a fault current of a fault frequency from the stator current, the set of filters includes a first filter to extract a first fault current of a first fault frequency and a second filter to extract a second fault current of a second fault frequency; and
  a set of quantitative models, each quantitative model is configured to relate the fault current of the fault frequency to a mutual inductance variation for the fault frequency, the set of quantitative models includes a first quantitative model to relate a magnitude of the first fault current to a first mutual inductance variation for the first fault frequency and a second quantitative model to relate the second fault current to a second mutual inductance variation for the second fault frequency; at least one fault severity classifier for estimating a severity of the fault in the induction motor for each of the fault frequency based on the mutual inductance variation for the fault frequency;

a processor configured, upon receiving the measurements of the stator current, to extract the first fault current from the stator current using the first filter, determine the first mutual inductance variation from the first fault current using the first quantitative model, and classify the first mutual inductance variation with the fault severity classifier to determine the severity of a first type of fault in the induction motor; and extract the second fault current from the stator current using the second filter, determine the second mutual inductance variation from the second fault current using the second quantitative model, and classify the second mutual inductance variation with the fault severity classifier to determine the severity of a second type of fault in the induction motor; and an output interface configured to output one or combination of the severity of the first type of fault in the induction motor and the severity of the second type of fault in the induction motor, wherein a transfer function of the mutual inductance variation maps the mutual inductance variation to a length profile of an air gap between a stator and a rotor of the induction motor, such that the set of thresholds specify a set of values of the maximum variation in the length profile of the air gap.

15. A system for estimating a severity of a bearing fault in an induction motor, comprising:

an input interface configured to accept measurements of a stator current during an operation of the induction motor;

a memory configured to store a set of filters, each filter is configured to extract a fault current of a fault frequency from the stator current, the set of filters includes a first filter to extract a first fault current of a first fault frequency and a second filter to extract a second fault current of a second fault frequency; and a set of quantitative models, each quantitative model is configured to relate the fault current of the fault frequency to a mutual inductance variation for the fault frequency, the set of quantitative models includes a first quantitative model to relate a magnitude of the first fault current to a first mutual inductance variation for the first fault frequency and a second quantitative model to relate the second fault current to a second mutual inductance variation for the second fault frequency; at least one fault severity classifier for estimating a severity of the fault in the induction motor for each of the fault frequency based on the mutual inductance variation for the fault frequency;

a processor configured, upon receiving the measurements of the stator current, to extract the first fault current from the stator current using the first filter, determine the first mutual inductance variation from the first fault current using the first quantitative model, and classify the first mutual inductance variation with the fault severity classifier to determine the severity of a first type of fault in the induction motor; and extract the second fault current from the stator current using the second filter, determine the second mutual inductance variation from the second fault current using the second quantitative model, and classify the second mutual inductance variation with the fault severity classifier to determine the severity of a second type of fault in the induction motor; and an output interface configured to output one or combination of the severity of the first type of fault in the induction motor and the severity of the second type of fault in the induction motor, wherein a fault severity classifier compares a transfer function of the first and the second mutual inductance variations with at least one threshold from the set of thresholds to determine the severity of the first and the second type of fault in the induction motor.

* * * * *